US008654586B2

(12) United States Patent (10) Patent No.: US 8,654,586 B2
Kito et al. (45) Date of Patent: Feb. 18, 2014

(54) NONVOLATILE SEMICONDUCTOR MEMORY DEVICE

(71) Applicant: Kabushiki Kaisha Toshiba, Tokyo (JP)

(72) Inventors: Masaru Kito, Kanagawa-ken (JP); Ryota Katsumata, Kanagawa-ken (JP); Yoshiaki Fukuzumi, Kanagawa-ken (JP); Masaru Kidoh, Tokyo (JP); Hiroyasu Tanaka, Tokyo (JP); Yosuke Komori, Mie-ken (JP); Megumi Ishiduki, Kanagawa-ken (JP); Junya Matsunami, Kanagawa-ken (JP); Tomoko Fujiwara, Kanagawa-ken (JP); Hideaki Aochi, Kanagawa-ken (JP); Ryouhei Kirisawa, Kanagawa-ken (JP); Yoshimasa Mikajiri, Kanagawa-ken (JP); Shigeto Oota, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/737,480

(22) Filed: Jan. 9, 2013

(65) Prior Publication Data

US 2013/0121081 A1 May 16, 2013

Related U.S. Application Data

(62) Division of application No. 12/728,694, filed on Mar. 22, 2010, now Pat. No. 8,374,033.

(30) Foreign Application Priority Data

Jul. 6, 2009 (JP) ................................. 2009-159536

(51) Int. Cl.
*G11C 16/04* (2006.01)

(52) U.S. Cl.
USPC ............ 365/185.18; 365/185.05; 365/185.26; 365/185.17; 365/185.14

(58) Field of Classification Search
USPC ............. 365/185.18, 185.05, 185.26, 185.17, 365/185.14
See application file for complete search history.

(56) References Cited

U.S. PATENT DOCUMENTS 6,034,882 A 3/2000 Johnson et al.
7,157,314 B2 1/2007 Subramanian et al.
(Continued)

FOREIGN PATENT DOCUMENTS

JP 7-320487 12/1995
JP 2007-42165 2/2007
(Continued)

OTHER PUBLICATIONS

Office Action issued Jul. 8, 2013 in Japanese Application No. 2009-159536 (With English Translation).

(Continued)

*Primary Examiner* — Viet Q Nguyen
(74) *Attorney, Agent, or Firm* — Oblon, Spivak, McClelland, Maier & Neustadt, L.L.P.

(57) ABSTRACT

A nonvolatile semiconductor memory device includes a memory unit and a control unit. The memory unit includes a multilayer structure including electrode films and inter-electrode insulating films alternately stacked in a first direction; a semiconductor pillar piercing the multilayer structure in the first direction; a memory layer provided between the semiconductor pillar and the electrode films; an inner insulating film provided between the memory layer and the semiconductor pillar; an outer insulating film provided between the memory layer and the electrode films; and a wiring electrically connected to the first semiconductor pillar. In an erasing operation, the control unit sets the first wiring at a first potential and sets the electrode film at a second potential lower than the first potential, and then sets the first wiring at a third potential and sets the electrode film at a fourth potential higher than the third potential.

11 Claims, 18 Drawing Sheets

(56) References Cited

U.S. PATENT DOCUMENTS

| | | |
|---|---|---|
| 7,705,388 B2 | 4/2010 | Iwata |
| 7,982,261 B2 | 7/2011 | Kidoh et al. |
| 8,017,993 B2 | 9/2011 | Kidoh et al. |
| 8,063,394 B2 | 11/2011 | Andres et al. |
| 8,089,120 B2 | 1/2012 | Tanaka et al. |
| 8,115,245 B2 | 2/2012 | Yoshimizu et al. |
| 8,194,467 B2 * | 6/2012 | Mikajiri et al. .......... 365/185.29 |
| 8,237,213 B2 * | 8/2012 | Liu ............................... 257/319 |
| 8,374,033 B2 * | 2/2013 | Kito et al. ................. 365/185.18 |
| 8,405,141 B2 * | 3/2013 | Matsuda et al. .............. 257/324 |
| 2007/0252201 A1 | 11/2007 | Kito et al. |
| 2009/0052255 A1 | 2/2009 | Moon et al. |

FOREIGN PATENT DOCUMENTS

| | | |
|---|---|---|
| JP | 2007-266143 | 10/2007 |
| JP | 2008-262626 | 10/2008 |
| JP | 2009-146954 | 7/2009 |
| WO | WO 2009/075370 | 6/2009 |

OTHER PUBLICATIONS

Office Action issued May 9, 2011, in Korean Patent Application No. 10-2010-0022714 (with English translation).

Takashi Maeda, et al. "Multi-stacked 1G cell/layer Pipe-shaped BiCS Flash Memory", 2009 Symposium on VLSI Circuits, Jun. 16-18, 2009, pp. 22-23.

* cited by examiner

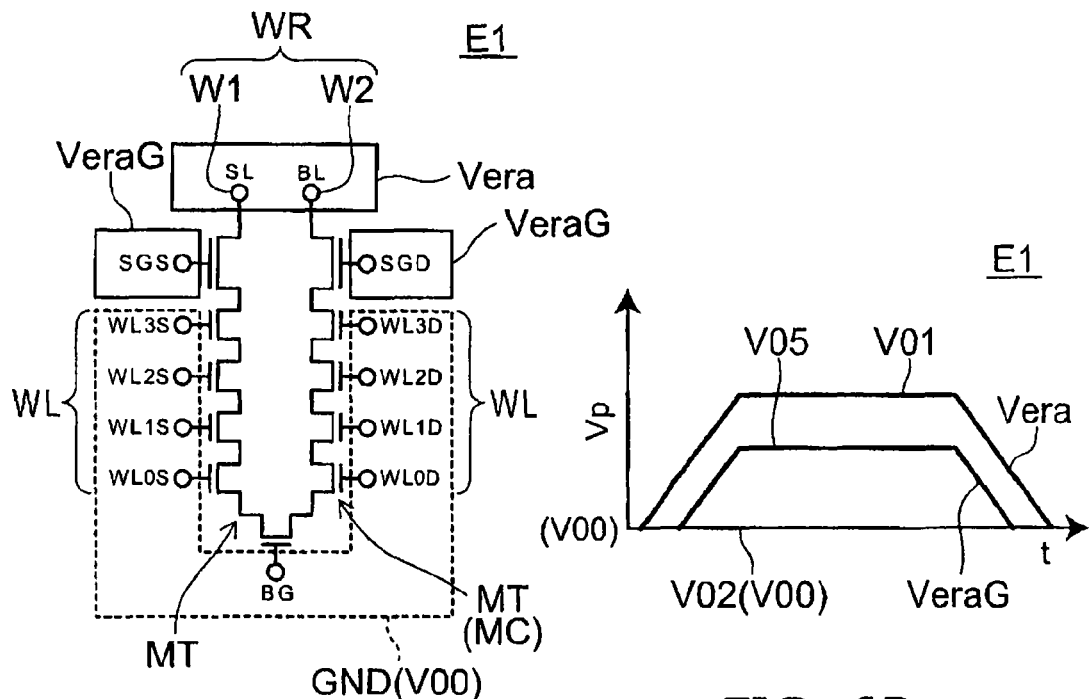
FIG. 6A
FIG. 6B
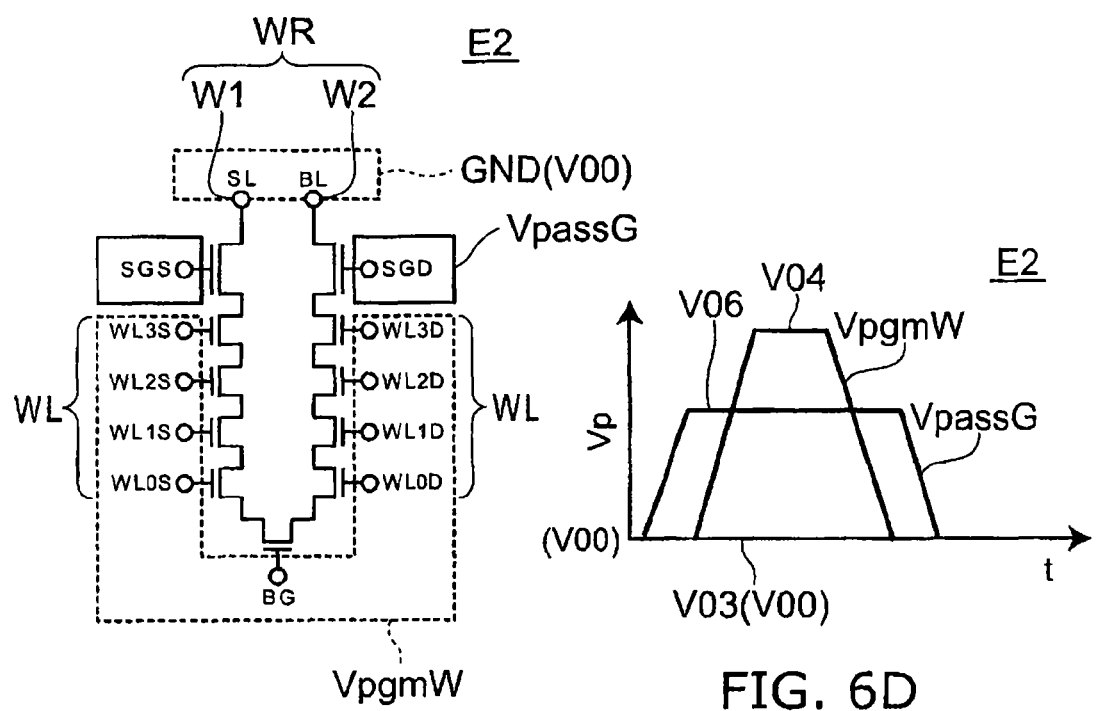
FIG. 6C
FIG. 6D

US 8,654,586 B2

NONVOLATILE SEMICONDUCTOR MEMORY DEVICE

CROSS-REFERENCE TO RELATED APPLICATIONS

This application is a Division of and claims the benefit or priority under 35 U.S.C. §120 from U.S. Ser. No. 12/728,694, filed Mar. 22, 2010, and claims the benefit of priority from the prior Japanese Patent Application No. 2009-159536, filed on Jul. 6, 2009; the entire contents of which are incorporated herein by reference.

BACKGROUND

1. Field

Embodiments of the invention relate generally to a nonvolatile semiconductor memory device.

2. Description of the Related Art

A collectively patterned three-dimensional multilayer memory is presented in order to increase the memory capacity of a nonvolatile semiconductor memory device (memory) (for example, refer to JP-A 2007-266143 (Kokai)). This method can collectively form a multilayer memory irrespective of the number of stacked layers and therefore can suppress the increase of cost.

In the collectively patterned three-dimensional multilayer memory, insulating films and electrode films (to form word lines) are alternately stacked to form a multilayer body and through holes are collectively formed in the multilayer body. Then, a charge storage layer (memory layer) is formed on the side face of the through hole and silicon is buried in the through hole to form a silicon pillar. A tunnel insulating film is provided between the charge storage layer and the silicon pillar, and a block insulating film is provided between the charge storage layer and the electrode film. Thereby, a memory cell made of, for example, a MONOS (metal oxide nitride oxide semiconductor) transistor is formed at the intersection of each electrode film and the silicon pillar.

In such a collectively patterned three-dimensional multilayer memory, the block insulating film, the charge storage layer, the tunnel insulating film, a channel silicon (to form the silicon pillar; for example, amorphous silicon) are formed in this order on the side wall of the electrode film inside the through hole. Therefore, the film-formation order is opposite to that of conventional planar MONOS memory, and in particular the state of the interface between the tunnel insulating film and the channel silicon is significantly different between both.

That is, whereas in the case of the planar type, an oxidized interface formed by thermal oxidation of the channel silicon is formed between the tunnel insulating film and the channel silicon; in the case of the collectively patterned three-dimensional multilayer memory, an interface made by only film-forming amorphous silicon for channel on the tunnel insulating film is formed. At such an interface as the latter made by only the film-formation, a large number of energy levels that easily become trap sites of charges such as dangling bonds are generated, which may have a bad effect on device operation and reliability.

For example, when holes are injected from the channel side toward the charge storage layer in data erasing, the holes are captured not only in the charge storage layer but also in traps at the channel interface. If the holes captured in traps at shallow energy levels near the channel interface are released, data retention characteristics at the time of erasing degrade. Likewise, in data writing, injected electrons are captured in traps at the channel interface; and if the electrons are released, data retention characteristics at the time of writing degrade.

Thus, peculiarly in the collectively patterned three-dimensional multilayer memory, traps easily occur near the channel interface and this may degrade data retention characteristics; and there is room for improvement.

SUMMARY

According to an aspect of the invention, there is provided a nonvolatile semiconductor memory device including: a memory unit; and a control unit, the memory unit including: a multilayer structure including a plurality of electrode films and a plurality of inter-electrode insulating films alternately stacked in a first direction; a first semiconductor pillar piercing the multilayer structure in the first direction; a first memory layer provided between the first semiconductor pillar and each of the electrode films; a first inner insulating film provided between the first memory layer and the first semiconductor pillar; a first outer insulating film provided between the first memory layer and each of the electrode films; and a first wiring electrically connected to one end of the first semiconductor pillar, and the control unit, in an operation of performing at least one of injection of a hole into the first memory layer and extraction of an electron from the first memory layer, performing a first operation of setting the first wiring at a first potential and setting the electrode film at a second potential lower than the first potential and then performing a second operation of setting the first wiring at a third potential and setting the electrode film at a fourth potential higher than the third potential.

According to another aspect of the invention, there is provided a nonvolatile semiconductor memory device including: a memory unit; and a control unit, the memory unit including: a multilayer structure including a plurality of electrode films and a plurality of inter-electrode insulating films alternately stacked in a first direction; a first semiconductor pillar piercing the multilayer structure in the first direction; a plurality of first memory layers provided between each of the electrode films and the first semiconductor pillar; a first inner insulating film provided between the first memory layer and the first semiconductor pillar; a first outer insulating film provided between each of the electrode films and the first memory layer; and a first wiring electrically connected to one end of the first semiconductor pillar, and the control unit, in an operation of performing at least one of injection of an electron into at least one of the plurality of first memory layers and extraction of a hole from the at least one of the first memory layers, performing a third operation of setting the first wiring at a seventh potential and setting the electrode film opposed to the at least one of the first memory layers at an eighth potential higher than the seventh potential and then performing a fourth operation of setting the first wiring at a ninth potential and setting the electrode film opposed to the at least one of the first memory layers at a tenth potential lower than the ninth potential

BRIEF DESCRIPTION OF THE DRAWINGS

FIGS. 6A to 6D are schematic diagrams illustrating an operation of the nonvolatile semiconductor memory device according to the first embodiment;

DETAILED DESCRIPTION

Figure 1:
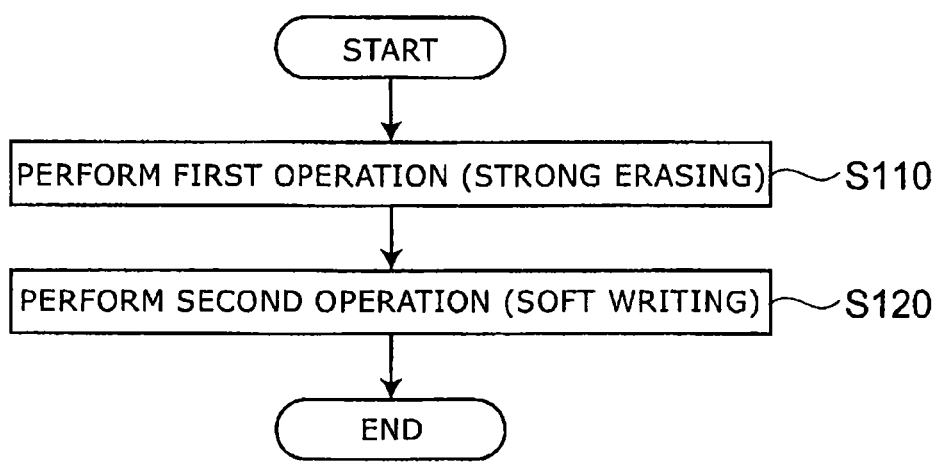
FIG. 1 is a flow chart illustrating an operation of a nonvolatile semiconductor memory device according to a first embodiment.

Embodiments of the invention will now be described with reference to the drawings.

The drawings are schematic or conceptual. The relationships between the thickness and width of portions, the proportional coefficients of sizes among portions, etc., are not necessarily the same as the actual values thereof. Further, the dimensions and proportional coefficients may be illustrated differently among drawings, even for identical portions.

In the specification and the drawings of the application, components similar to those described in regard to a drawing thereinabove are marked with like reference numerals, and a detailed description is omitted as appropriate.

First Embodiment

A nonvolatile semiconductor memory device according to a first embodiment of the invention improves data retention characteristics in the erase operation.

FIG. 1 is a flow chart illustrating an operation of a nonvolatile semiconductor memory device according to the first embodiment.

Figure 2:
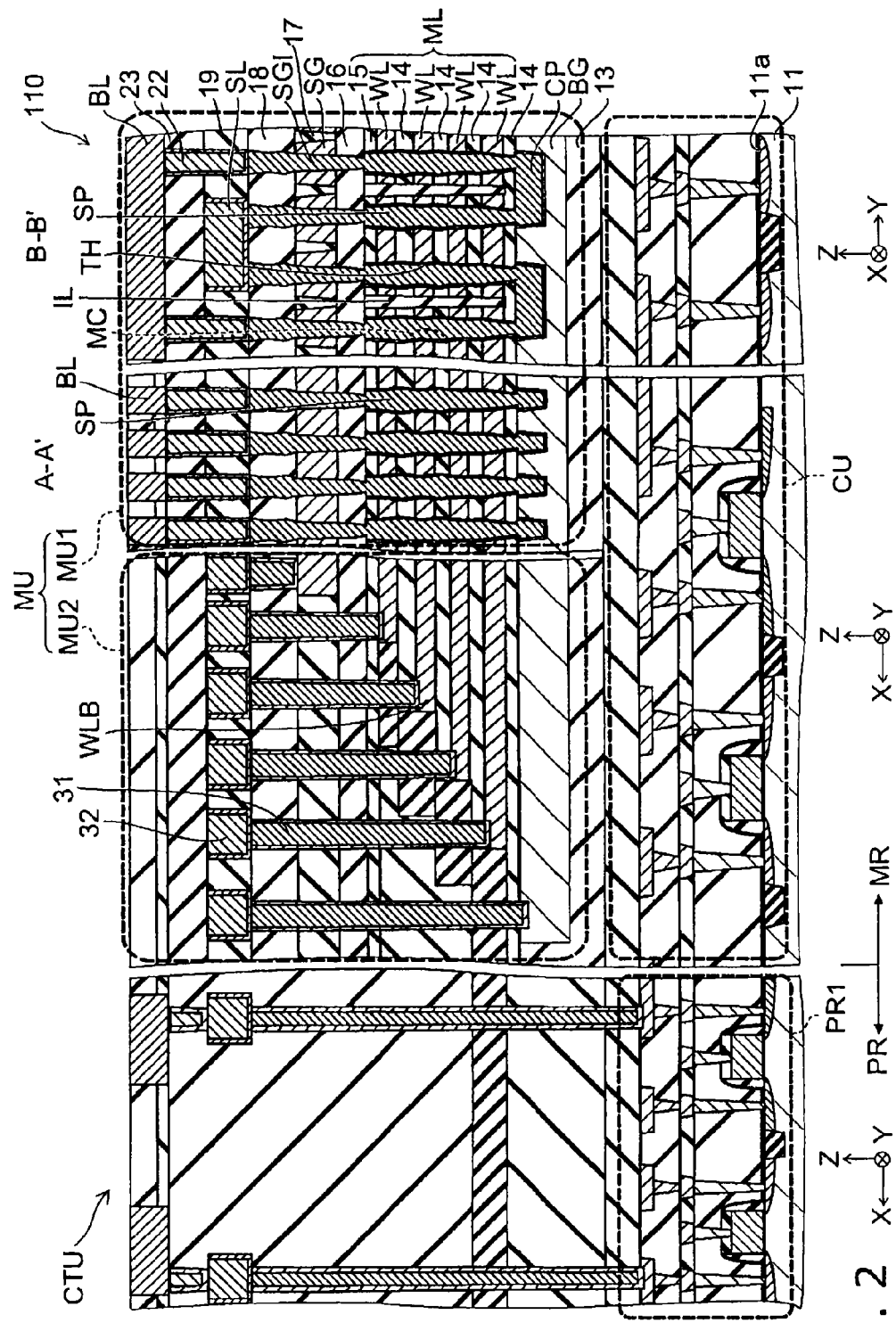
FIG. 2 is a schematic cross-sectional view illustrating the configuration of the nonvolatile semiconductor memory device according to the first embodiment.
Figure 3:
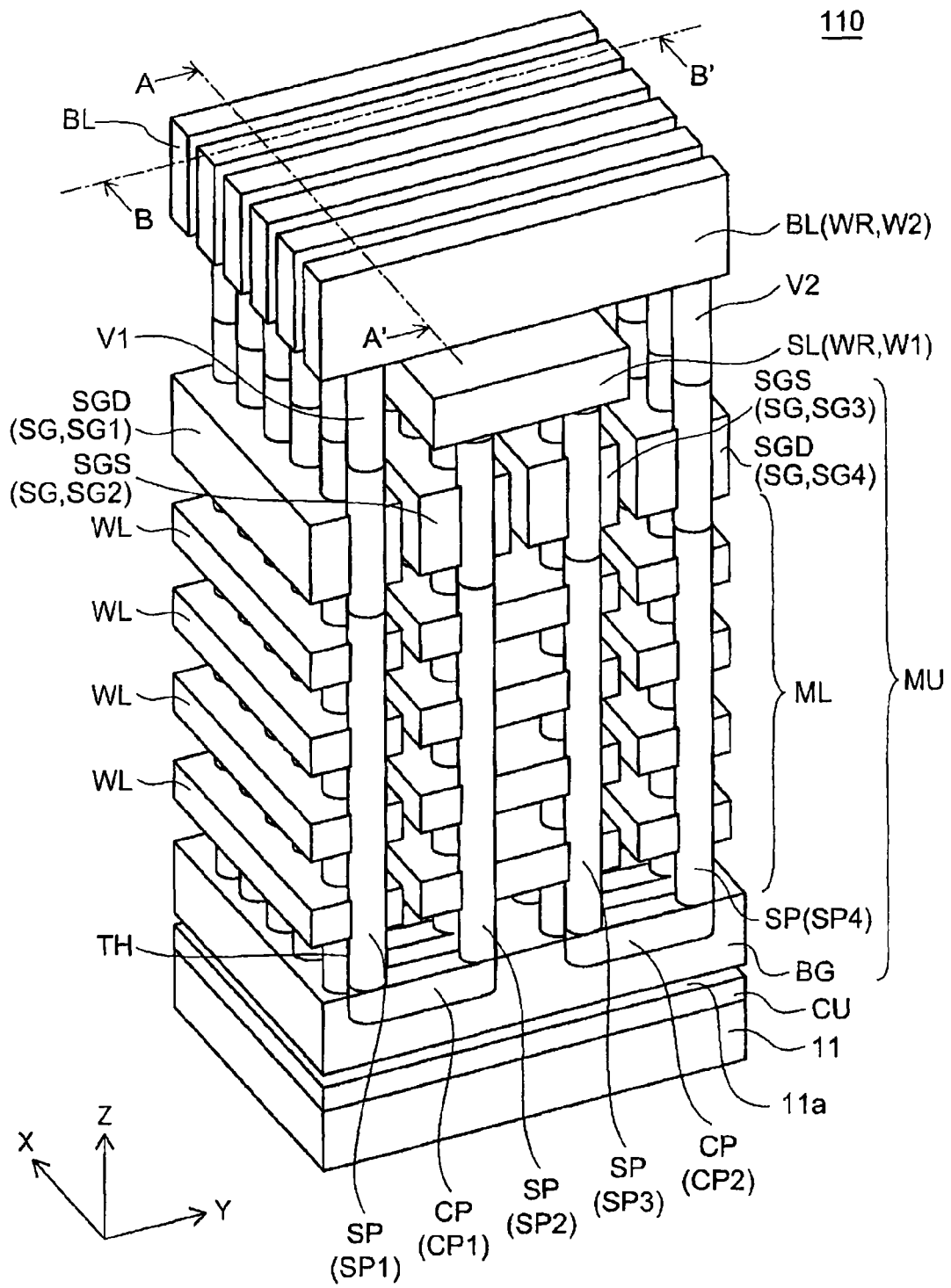
FIG. 3 is a schematic perspective view illustrating the configuration of the nonvolatile semiconductor memory device according to the first embodiment.
Figure 4:
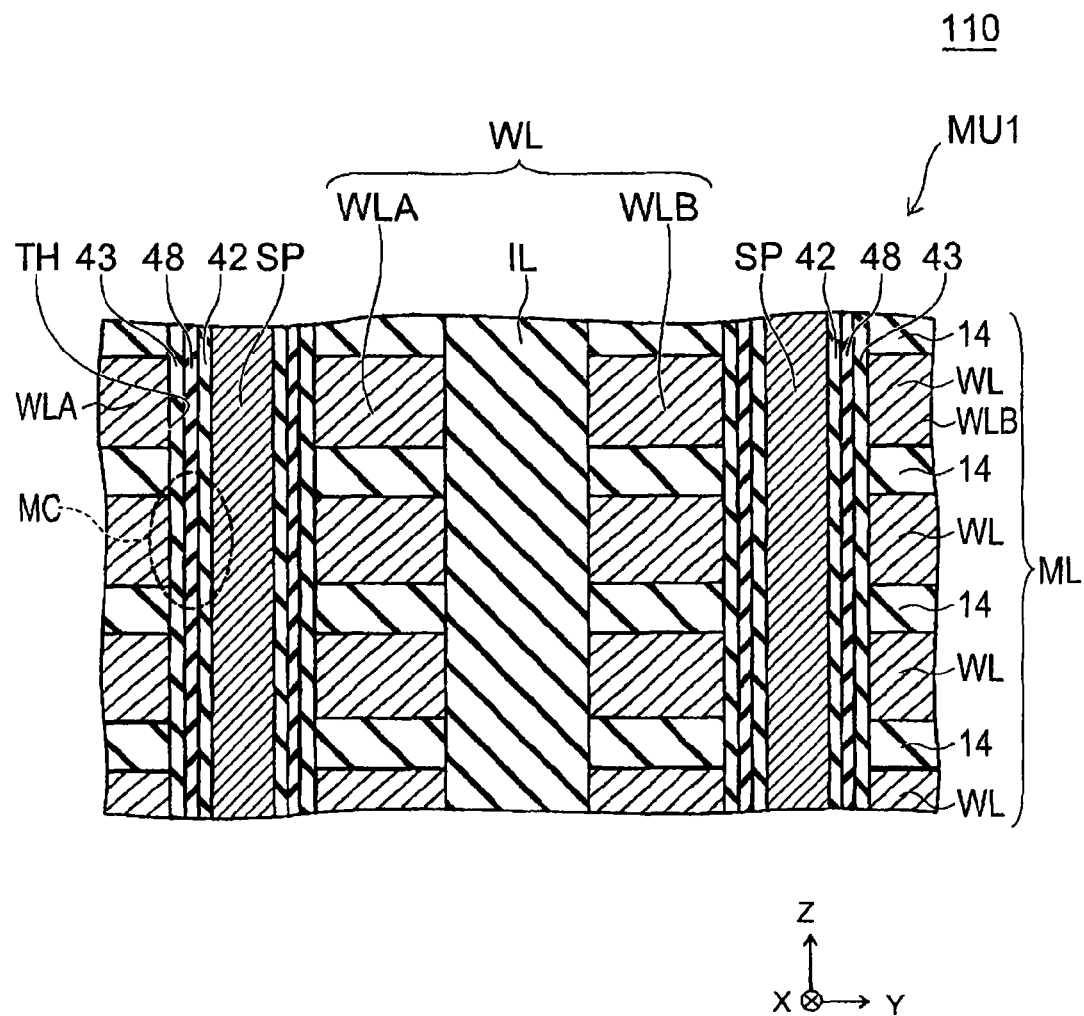
FIG. 4 is a schematic cross-sectional view illustrating the configuration of the nonvolatile semiconductor memory device according to the first embodiment.

FIG. 2, FIG. 3, and FIG. 4 are a schematic cross-sectional view, a schematic perspective view, and a schematic cross-sectional view, respectively, illustrating the configuration of the nonvolatile semiconductor memory device according to the first embodiment.

For easier viewing of the drawing, FIG. 3 illustrates only conductive portions, and insulating portions are omitted.

Figure 5:
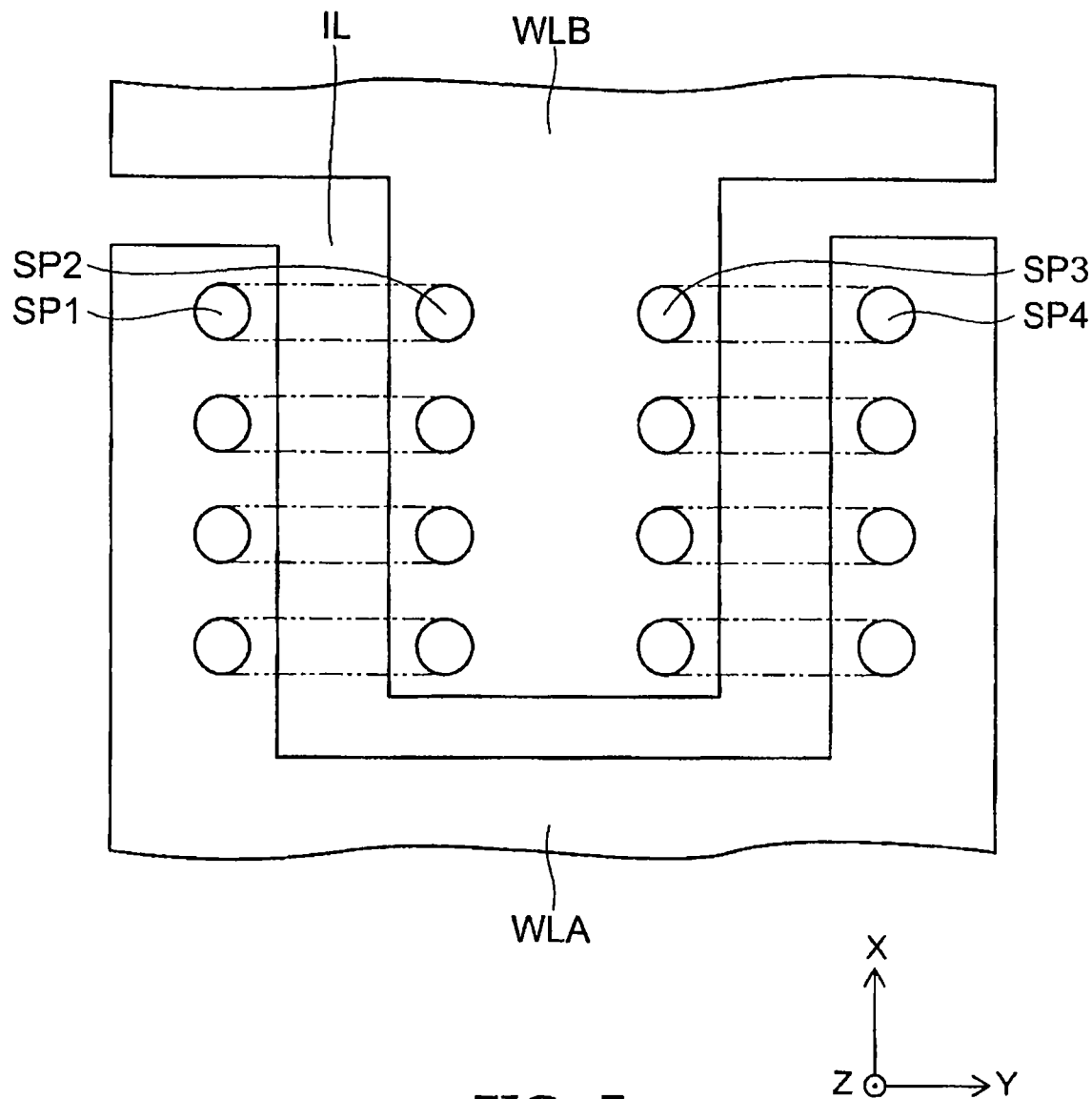
FIG. 5 is a schematic plan view illustrating an electrode film of the nonvolatile semiconductor memory device according to the first embodiment.

FIG. 5 is a schematic plan view illustrating the configuration of an electrode film of the nonvolatile semiconductor memory device according to the first embodiment.

A nonvolatile semiconductor memory device 110 according to this embodiment is a collectively patterned three-dimensional multilayer flash memory.

First, the overview of the configuration of the nonvolatile semiconductor memory device 110 is described with reference to FIG. 2 to FIG. 5.

As illustrated in FIG. 2, the nonvolatile semiconductor memory device 110 includes a memory unit MU and a control unit CTU. The memory unit MU and the control unit CTU are provided above a major surface 11a of a semiconductor substrate 11 made of, for example, single crystal silicon. However, the control unit CTU may be provided above a substrate different from the substrate above which the memory unit MU is provided. In the following, the case is described where the memory unit MU and the control unit CTU are provided above the same substrate (the semiconductor substrate 11).

On the semiconductor substrate 11, for example, a memory array region MR in which memory cells are provided and a peripheral region PR provided, for example, around the memory array region MR are defined. In the peripheral region PR, various peripheral region circuits PR1 are provided on the semiconductor substrate 11.

In the memory array region MR, a circuit unit CU, for example, is provided on the semiconductor substrate 11, and the memory unit MU is provided on the circuit unit CU. The circuit unit CU is provided as necessary and may be omitted. An interlayer insulating film 13 made of, for example, silicon oxide is provided between the circuit unit CU and the memory unit MU.

At least part of the control unit CTU, for example, may be provided, for example, in at least one of the peripheral region circuits PR1 and the circuit unit CU mentioned above.

The memory unit MU includes: a matrix memory cell unit MU1 including a plurality of memory cell transistors; and an interconnect connecting unit MU2 connecting interconnections of the matrix memory cell unit MU1.

FIG. 3 illustrates the configuration of the matrix memory cell unit MU1.

That is, FIG. 2 illustrates part of the A-A' cross section of FIG. 3 and part of the B-B' cross section of FIG. 3 as the matrix memory cell unit MU1.

As illustrated in FIG. 2 and FIG. 3, in the matrix memory cell unit MU1, a multilayer structure ML is provided above the major surface 11a of the semiconductor substrate 11. The multilayer structure ML includes a plurality of electrode films WL and a plurality of inter-electrode insulating films 14 alternately stacked in the direction perpendicular to the major surface 11a.

Here, in the specification of the application, for convenience of description, an XYZ orthogonal coordinate system is used. In this coordinate system, the direction perpendicular to the major surface 11a of the semiconductor substrate 11 is taken as a Z-axis direction (first direction). One direction in a plane parallel to the major surface 11a is taken as a Y-axis direction (second direction). A direction perpendicular to the Z axis and the Y axis is taken as an X-axis direction (third direction).

The stacking direction of the electrode films WL and the inter-electrode insulating films 14 in the multilayer structure ML is the Z-axis direction. That is, the electrode films WL and the inter-electrode insulating films 14 are provided parallel to the major surface 11a. The electrode film WL is divided for each erasing block, for example.

FIG. 4 illustrates the configuration of the matrix memory cell unit MU1, and corresponds to, for example, part of the B-B' cross section of FIG. 3.

As illustrated in FIG. 3 and FIG. 4, the memory unit MU of the nonvolatile semiconductor memory device 110 includes the multilayer structure ML mentioned above, a semiconductor pillar SP (a first semiconductor pillar SP1) piercing the multilayer structure ML in the Z-axis direction, a memory layer 48, an inner insulating film 42, an outer insulating film 43, and a wiring WR.

The memory layer 48 is provided between each of the electrode films WL and the semiconductor pillar SP. The inner insulating film 42 is provided between the memory layer 48 and the semiconductor pillar SP. The outer insulating film 43 is provided between each of the electrode films WL and the memory layer 48. The wiring WR is electrically connected to one end of the semiconductor pillar SP.

That is, the outer insulating film 43, the memory layer 48, and the inner insulating film 42 are formed in this order on the inner wall face of the through hole TH piercing the multilayer structure ML in the Z-axis direction, and a semiconductor is buried in the remaining space to form the semiconductor pillar SP.

A memory cell MC is provided at the intersection of the electrode film WL of the multilayer structure ML and the semiconductor pillar SR. That is, memory cell transistors including the memory layer 48 are provided at the intersections of the electrode films WL and the semiconductor pillars SP in a three-dimensional matrix configuration, and each memory cell transistor functions as the memory cell MC that stores data by storing a charge in the memory layer 48.

The inner insulating film 42 functions as a tunnel insulating film in the memory cell transistor of the memory cell MC. On the other hand, the outer insulating film 43 functions as a block insulating film in the memory cell transistor of the memory cell MC. The inter-electrode insulating film 14 functions as an interlayer insulating film that insulates the electrode films WL from each other.

Any conductive material may be used for the electrode film WL. For example, amorphous silicon or polysilicon provided with conductivity by introducing an impurity, or metals, alloys, and the like may be used. A prescribed electric signal is applied to the electrode film WL, and the electrode film WL functions as a word line of the nonvolatile semiconductor memory device 110.

A silicon oxide film, for example, may be used for the inter-electrode insulating film 14, the inner insulating film 42, and the outer insulating film 43. The inter-electrode insulating film 14, the inner insulating film 42, and the outer insulating film 43 may be a single layer film or a stacked film.

A silicon nitride film, for example, may be used for the memory layer 48, and the memory layer 48 functions as a portion that stores or releases a charge by an electric field applied between the semiconductor pillar SP and the electrode film WL to store information. The memory layer 48 may be a single layer film or a stacked film.

As described later, the materials of the inter-electrode insulating film 14, the inner insulating film 42, the memory layer 48, and the outer insulating film 43 are not limited to the materials illustrated above, but any material may be used.

Although FIG. 2 and FIG. 3 illustrate the case where the multilayer structure ML includes four electrode films WL, the number of electrode films WL provided in the multilayer structure ML is arbitrary. In the following, the case is described where the number of electrode films WL is four.

In this specific example, two semiconductor pillars SP are connected by a connecting portion CP. That is, the memory unit MU further includes a second semiconductor pillar SP2 (the semiconductor pillar SP) and a first connecting portion CP1 (the connecting portion CP).

The second semiconductor pillar SP2 is adjacent to the first semiconductor pillar SP1 (the semiconductor pillar SP) in the Y-axis direction, for example, and pierces the multilayer structure ML in the Z-axis direction. The first connecting portion CP1 electrically connects the first semiconductor pillar SP1 and the second semiconductor pillar SP2 on the same side in the Z-axis direction (the semiconductor substrate 11 side). The first connecting portion CP1 is provided to align in the Y-axis direction. The same material as the first and second semiconductor pillars SP1 and SP2 is used for the first connecting portion CP1.

That is, a back gate BG (a connecting portion conductive layer) is provided above the major surface 11a of the semiconductor substrate 11 via the interlayer insulating film 13. A trench is provided in a portion of the back gate BG opposed to the first and second semiconductor pillars SP1 and SP2. The outer insulating film 43, the memory layer 48, and the inner insulating film 42 are formed in the trench, and the connecting portion CP made of a semiconductor is buried in the remaining space. The formation of the outer insulating film 43, the memory layer 48, the inner insulating film 42, and the connecting portion CP in the trench is performed collectively at the same time as the formation of the outer insulating film 43, the memory layer 48, the inner insulating film 42, and the semiconductor pillar SP in the through hole TH. Thus, the back gate BG is provided opposite to the connecting portion CP.

Thereby, a U-shaped semiconductor pillar is formed by the first and second semiconductor pillars SP1 and SP2 and the connecting portion CP to form a U-shaped NAND string.

However, the invention is not limited thereto. As described later, each semiconductor pillar SP may be independent and not be connected by the connecting portion CP on the semiconductor substrate 11 side. In the following, the case is described where two semiconductor pillars SP are connected by the connecting portion CP.

As illustrated in FIG. 2 and FIG. 3, the opposite end of the first semiconductor pillar SP1 from the first connecting portion CP1 is connected to a bit line BL (a second wiring W2), and the opposite end of the second semiconductor pillar SP2 from the first connecting portion CP1 is connected to a source line SL (a first wiring W1). The semiconductor pillars SP and the bit line BL are connected by a via V1 and a via V2. The wiring WR includes the first wiring W1 and the second wiring W2.

In this specific example, the bit line BL aligns in the Y-axis direction and the source line SL aligns in the X-axis direction.

Between the multilayer structure ML and the bit line BL, a drain side selection gate electrode SGD (a first selection gate electrode SG1, that is, a selection gate electrode SG) is provided opposite to the first semiconductor pillar SP1, and a source side selection gate electrode SGS (a second selection gate electrode SG2, that is, the selection gate electrode SG) is provided opposite to the second semiconductor pillar SP2. Thereby, desired data can be written on and read out from any memory cell MC of any semiconductor pillar SP.

Any conductive material may be used for the selection gate electrode SG. For example, polysilicon or amorphous silicon may be used. In this specific example, the selection gate electrode SG is divided in the Y-axis direction and has a band configuration aligned along the X-axis direction.

As illustrated in FIG. 2, an interlayer insulating film 15 is provided at the top (on the side farthest from the semiconductor substrate 11) of the multilayer structure ML. An interlayer insulating film 16 is provided on the multilayer structure ML; the selection gate electrode SG is provided thereon; and an interlayer insulating film 17 is provided between the selection gate electrodes SG. A through hole is provided in the selection gate electrode SG; a selection gate insulating film SGI of a selection gate transistor is provided on the inner face of the through hole; and a semiconductor is buried thereinside. This semiconductor is connected to the semiconductor pillar SP. Thus, a selection gate transistor is formed at the intersection of the selection gate electrode SG and the semiconductor pillar SP.

That is, the memory unit MU further includes the selection gate electrode SG stacked on the multilayer structure ML in the Z-axis direction and pierced by the semiconductor pillar SP, on the side of the wiring WR (at least one of the source line SL and the bit line BL).

An interlayer insulating film 18 is provided on the interlayer insulating film 17; the source line SL and a via 22 (the vias V1 and V2) are provided thereon; and an interlayer insulating film 19 is provided around the source line SL. An interlayer insulating film 23 is provided on the source line SL, and the bit line BL is provided thereon. The bit line BL has a band configuration along the Y axis.

Silicon oxide, for example, may be used for the interlayer insulating films 15, 16, 17, 18, 19, and 23 and the selection gate insulating film SGI.

Here, in regard to the semiconductor pillar provided in plural in the nonvolatile semiconductor memory device 110, "semiconductor pillar SP" is used to refer to all of the semiconductor pillars or any semiconductor pillar; and "n-th semiconductor pillar SPn" (n being any integer not less than 1) is used to refer to a specific semiconductor pillar in those cases of describing the relationship between semiconductor pillars etc.

As illustrated in FIG. 5, in regard to the electrode film WL, the electrode films corresponding to the semiconductor pillars SP(4m+1) and SP(4m+4) are commonly connected to form an electrode film WLA, where m is an integer not less than 0 and n is (4m+1) and (4m+4); and the electrode films corresponding to the semiconductor pillars SP(4m+2) and SP(4m+3) are commonly connected to form an electrode film WLB, where n is (4m+2) and (4m+3). In other words, the electrode film WL has a form in which the electrode film WLA and the electrode film WLB are combined with each other in a comb teeth configuration opposing in the X-axis direction.

As illustrated in FIG. 4 and FIG. 5, the electrode film WL is divided by an insulating layer IL into a first region (the electrode film WLA) and a second region (the electrode film WLB).

As illustrated in the interconnect connecting unit MU2 illustrated in FIG. 2, the electrode film WLB is connected to a word line 32 by a via plug 31 at one end in the X-axis direction to be electrically connected to, for example, a driving circuit provided in the semiconductor substrate 11. Similarly, the electrode film WLA is connected to a word line by a via plug at the other end in the X-axis direction to be electrically connected to the driving circuit. In other words, the length in the X-axis direction of each of the electrode films WL (the electrode films WLA and the electrode films WLB) stacked in the Z-axis direction changes into a stairstep configuration; and an electrical connection with the driving circuit is performed by the electrode film WLA at one end in the X-axis direction, and an electrical connection with the driving circuit is performed by the electrode film WLB at the other end in the X-axis direction.

As illustrated in FIG. 3, the memory unit MU may further include a third semiconductor pillar SP3 (the semiconductor pillar SP), a fourth semiconductor pillar SP4 (the semiconductor pillar SP), and a second connecting portion CP2 (the connecting portion CP).

The third semiconductor pillar SP3 is adjacent to the second semiconductor pillar SP2 on the opposite side of the second semiconductor pillar SP2 from the first semiconductor pillar SP1 in the Y-axis direction, and pierces the multilayer structure ML in the Z-axis direction. The fourth semiconductor pillar SP4 is adjacent to the third semiconductor pillar SP3 on the opposite side of the third semiconductor pillar SP3 from the second semiconductor pillar SP2 in the Y-axis direction and pierces the multilayer structure ML in the Z-axis direction.

The second connecting portion CP2 electrically connects the third semiconductor pillar SP3 and the fourth semiconductor pillar SP4 on the same side in the Z-axis direction (the same side as the first connecting portion CP1). The second connecting portion CP2 is provided to align in the Y-axis direction and is opposed to the back gate BG.

The memory layer 48 is provided also between each of the electrode films WL, and the third and fourth semiconductor pillars SP3 and SP4, and between the back gate BG and the second connecting portion CP2. The inner insulating film 42 is provided also between the third and fourth semiconductor pillars SP3 and SP4, and the memory layer 48, and between the memory layer 48 and the second connecting portion CP2. The outer insulating film 43 is provided also between each of the electrode films WL and the memory layer 48, and between the memory layer 48 and the back gate BG.

The source line SL is connected to a third end of the third semiconductor pillar SP3 on the side opposite to the second connecting portion CP2. The bit line BL is connected to a fourth end of the fourth semiconductor pillar SP4 on the side opposite to the second connecting portion CP2.

The source side selection gate electrode SGS (a third selection gate electrode SG3, that is, the selection gate electrode SG) is provided opposite to the third semiconductor pillar SP3, and the drain side selection gate electrode SGD (a fourth selection gate electrode SG4, that is, the selection gate electrode SG) is provided opposite to the fourth semiconductor pillar SP4.

As illustrated in FIG. 1, in the nonvolatile semiconductor memory device 110 having such a configuration, the control unit CTU performs, when performing the erase operation, a first operation that sets the wiring WR at a first potential V01 and sets the electrode film WL at a second potential V02 lower than the first potential V01 (step S110).

After that, the control unit CTU performs a second operation that sets the wiring WR at a third potential V03 and sets the electrode film WL at a fourth potential V04 higher than the third potential V03 (step S120).

The erase operation is an operation that performs at least one of injection of holes into the memory layer 48 and extraction of electrons from the memory layer 48. That is, the memory cell transistor that forms the memory cell MC has the state of a low threshold (an erasing state) and the state of a relatively higher threshold than the state of a low threshold (a writing state). The erase operation is an operation that sets the threshold of the memory cell transistor to the lower side.

The write operation is an operation that performs at least one of injection of electrons into the memory layer 48 and extraction of holes from the memory layer 48. That is, the write operation is an operation that sets the threshold of the memory cell transistor to the higher side.

In the first operation, since the second potential V02 is lower than the first potential V01, the electrode film WL has a potential of negative polarity with reference to the wiring WR. Thereby, at least one of injection of holes into the memory layer 48 and extraction of electrons from the memory layer 48 is performed.

The first operation creates the state of a value slightly lower than the target threshold. That is, the first operation performs what is called "strong erasing."

In the second operation, since the fourth potential V04 is higher than the third potential V03, the electrode film WL has a potential of positive polarity with reference to the wiring WR. That is, the threshold of the memory cell transistor is set to a value slightly higher than the threshold set in the first operation so as to become the target threshold as a result. The operation at this time is not an operation that creates a data writing state but an operation of what is called "soft writing." For example, the difference between the fourth potential V04 and the third potential V03 is smaller than the difference between the first potential V01 and the second potential V02.

Thus, the erase operation may perform the combination of: "strong erasing" (the first operation) that temporarily sets the threshold deeply to a value lower than the target threshold to perform erasing; and "soft writing" (the second operation) that subsequently sets to the target threshold. Thereby, charges captured at shallow energy levels near the channel interface can be removed beforehand, and data retention characteristics in the erase operation can be improved.

A specific example of the operation of the control unit CTU will now be described.

FIGS. 6A to 6D are schematic diagrams illustrating an operation of the nonvolatile semiconductor memory device according to the first embodiment.

More specifically, FIGS. 6A and 6B are a schematic diagram and a graph, respectively, illustrating a state of potentials in the first operation. FIGS. 6C and 6D are a schematic diagram and a graph, respectively, illustrating a state of potentials in the second operation. In FIGS. 6B and 6D, the horizontal axis represents the time t, and the vertical axis represents the potential Vp.

Figure 7A:
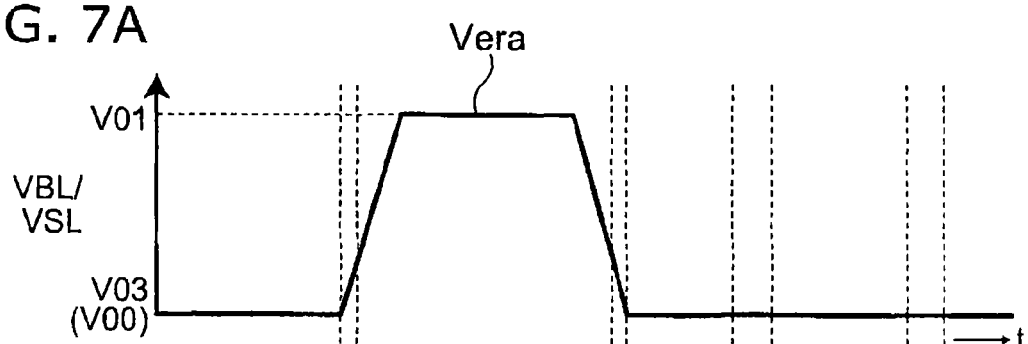
FIGS. 7A to 7C are schematic diagrams illustrating the operation of the nonvolatile semiconductor memory device according to the first embodiment.
Figure 7B:
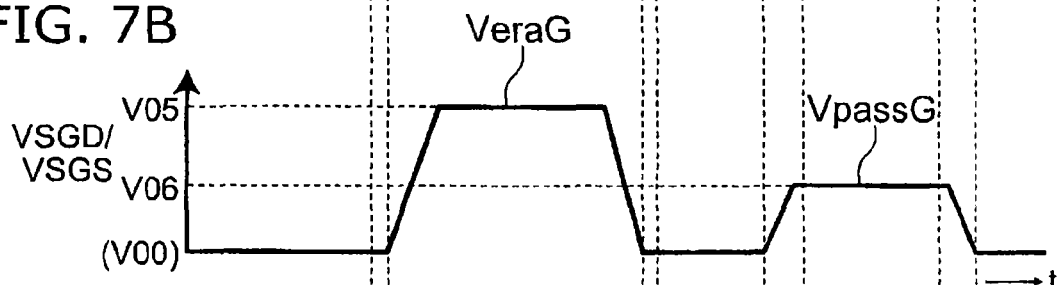
Figure 7C:
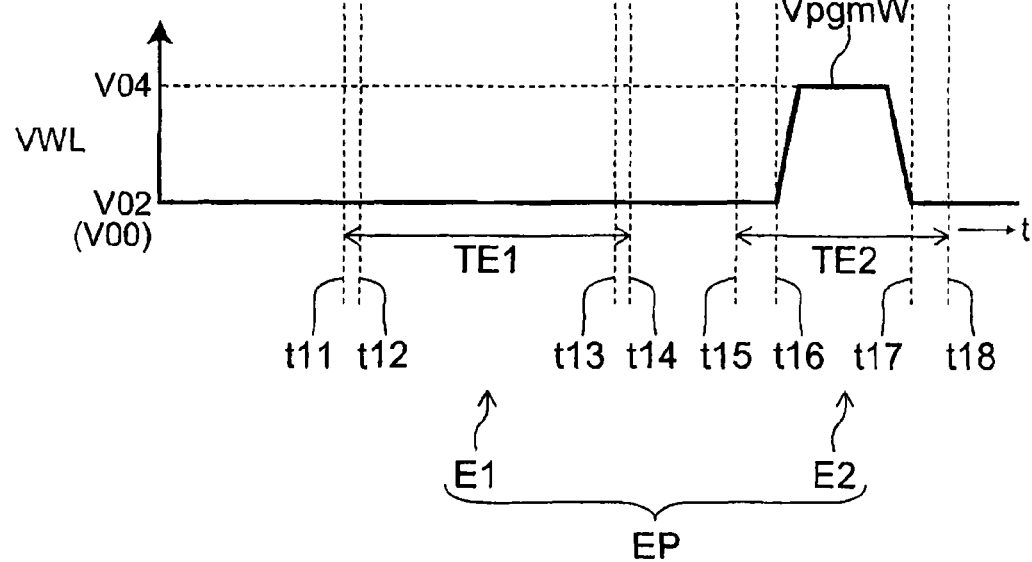

FIGS. 7A to 7C are schematic diagrams illustrating the operation of the nonvolatile semiconductor memory device according to the first embodiment. More specifically, FIG. 7A illustrates the potential of the wiring WR (the potential VBL of the bit line BL and the potential VSL of the source line SL) in the first operation and the second operation; FIG. 7B illustrates the potential VSGD of the drain side selection gate electrode SGD and the potential VSGS of the source side selection gate electrode SGS in the first operation and the second operation; and FIG. 7C illustrates the potential VWL of the electrode film WL in the first operation and the second operation.

Figure 8A:
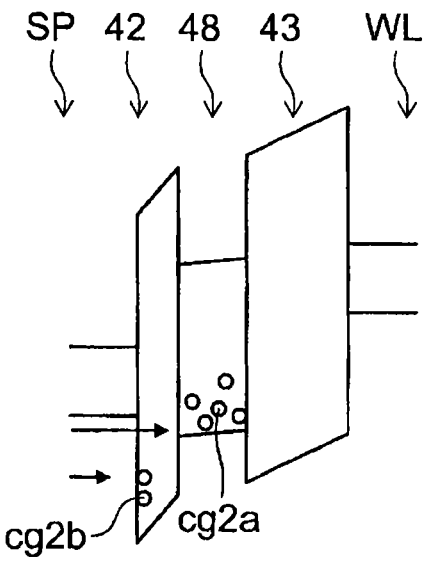
FIGS. 8A to 8C are schematic diagrams illustrating the operation of the nonvolatile semiconductor memory device according to the first embodiment.
Figure 8B:
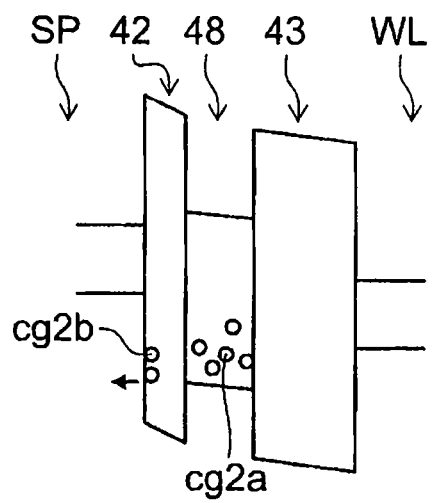
Figure 8C:
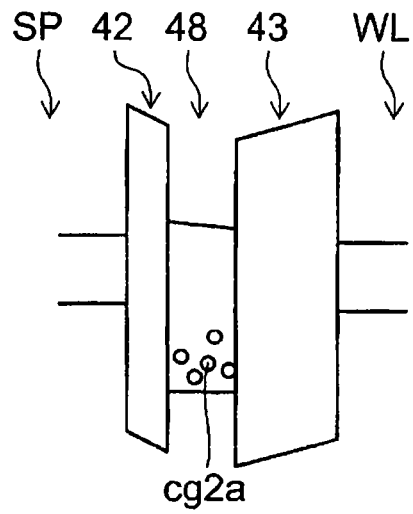

FIGS. 8A to 8C are schematic diagrams illustrating the operation of the nonvolatile semiconductor memory device according to the first embodiment.

More specifically, FIGS. 8A, 8B, and 8C are energy band diagrams in the first operation, in the second operation, and after the second operation, respectively.

As illustrated in FIGS. 6A and 6B, in the first operation E1, an erasing voltage Vera is applied to the wiring WR; a selection gate voltage in erasing VeraG is applied to the drain side selection gate electrode SGD and the source side selection gate electrode SGS; and the electrode film WL and the back gate BG are set at the ground potential GND (that is, a reference potential V00).

That is, in the first operation E1, the control unit CTU sets the wiring WR at the first potential V01 (the erasing voltage Vera) and sets the electrode film WL at the second potential V02 (the reference potential V00) lower than the first potential V01. Further, the control unit CTU sets the selection gate electrode SG at a fifth potential V05 (the selection gate voltage in erasing VeraG) lower than the first potential V01 and higher than the second potential V02.

For example, as illustrated in FIGS. 7A to 7C, in period TE1 in the first operation E1, the erasing voltage Vera rises from the reference potential V00 at time t11 to reach the first potential V01, and then lowers to return to the reference potential V00 at time t14. The selection gate voltage in erasing VeraG rises from a low potential (for example, the second potential V02, the reference potential V00) at time t12 to reach the fifth potential V05, and then lowers to return to the low potential (for example, the second potential V02, reference potential V00) at time t13. On the other hand, the potentials of the electrode film WL and the back gate BG are constant at the reference potential V00.

The first potential V01 is 20 V (volts), for example; the fifth potential V05 is 15 V, for example; and the reference potential V00 is 0 V, for example. Thus, the fifth potential V05 is lower than the first potential V0 and the difference between both is, for example, about 5 V. A difference between the erasing voltage Vera and the selection gate voltage in erasing VeraG is a value lower than the breakdown voltage of the selection gate transistor of the selection gate electrode SG.

Here, time t12 is a time not prior to time t11, and time t13 is a time not posterior to time t14. That is, the erasing voltage Vera is not less than the value of the selection gate voltage in erasing VeraG at any time.

Thus, in the first operation E1, the control unit CTU sets the potential of the electrode film WL to the second potential V02; starts to change the potential of the selection gate electrode SG from a low potential lower than the fifth potential (for example, the second potential V02) toward the fifth potential V05 not prior to starting to change the potential of the wiring WR from the third potential V03 toward the first potential V01; thereafter finishes changing the potential of the wiring WR from the first potential V01 to the third potential V03 not prior to finishing changing the potential of the selection gate electrode SG from the fifth potential V05 to the low potential lower than the fifth potential (for example, the second potential V02).

By applying the selection gate voltage in erasing VeraG described above to the drain side selection gate electrode SGD and the source side selection gate electrode SGS, GIDL (gate-induced drain leakage) can be caused in the semiconductor pillars SP near the portions opposed to the drain side selection gate electrode SGD and the source side selection gate electrode SGS without causing gate breakdown of the selection gate transistor.

By applying the erasing voltage Vera to the wiring WR, holes are injected into the memory layer 48 of the memory cell transistor MT formed at the intersection of the electrode film WL and the semiconductor pillar SP. At this time, the erasing voltage Vera is set so that the threshold of the memory cell transistor MT may be slightly lower than the target threshold of the erasing state. For example, when the target threshold is −2 V, the threshold of the memory cell transistor MT is set to about −3 V. That is, strong erasing is performed.

That is, as illustrated in FIG. 8A, holes are injected from the semiconductor pillar SP side toward the electrode film WL, and holes cg2a are captured in the memory layer 48. At this time, holes cg2b are captured also in traps at shallow energy levels at the interface between the semiconductor pillar SP and the inner insulating film 42 and in a portion of the inner insulating film 42 on the semiconductor pillar SP side.

After that, as illustrated in FIGS. 6C and 6D, in the second operation E2, the wiring WR is set at the ground potential GND (the reference potential V00); a selection gate pass voltage in soft writing VpassG is applied to the drain side selection gate electrode SGD and the source side selection gate electrode SGS; and a soft writing voltage VpgmW is applied to the electrode film WL and the back gate BG.

That is, in the second operation E2, the control unit CTU sets the wiring WR at the third potential V03 (the reference potential V00) and sets the electrode film WL at the fourth potential V04 (the soft writing voltage VpgmW) higher than the third potential V03. Further, the control unit CTU sets the selection gate electrode SG at a sixth potential V06 (the selection gate pass voltage in soft writing VpassG) higher than the third potential V03 and lower than the fourth potential V04. The difference between the sixth potential V06 and the third potential V03 (in this specific example, the reference potential V00) also is a value lower than the breakdown voltage of the selection gate transistor of the selection gate electrode SG.

For example, as illustrated in FIGS. 7A to 7C, in period TE2 in the second operation E2, the selection gate pass voltage in soft writing VpassG rises from a low potential (for example, the second potential, the reference potential V00) at time t15 to reach the sixth potential V06; and then lowers to return to the low potential (for example, the second potential, the reference potential V00) at time t18. The soft writing voltage VpgmW rises from the reference potential V00 at time t16 to reach the fourth potential V04; and then lowers to return to the reference potential V00 at time t17. Time t16 is a time not prior to time t15, and time t17 is a time not posterior to time t18. On the other hand, the potential of the wiring WR (the potentials VBL and VSL) is constant at the reference potential V00.

Thus, in the second operation E2, the control unit CTU sets the potential of the wiring WR to the third potential V03; starts to change the potential of the electrode film WL from a low potential lower than the fourth potential V04 (for example, the second potential V02) toward the fourth potential V04 not prior to starting to change the potential of the selection gate electrode SG from the second potential V02 toward the sixth potential V06; thereafter finishes changing the potential of the selection gate electrode SG from the sixth potential V06 toward the low potential lower than the fourth potential V04 (for example, the second potential V02) not prior to finishing changing the potential of the electrode film WL from the fourth potential V04 toward the second potential V02.

The fourth potential V04 is about 10 V, for example; the sixth potential V06 is about 5 V, for example; and the reference potential V00 is 0 V, for example. Here, the maximum value of the selection gate pass voltage in soft writing VpassG (that is, the difference between the sixth potential V06 and the reference potential V00) is a voltage of the level that switches the drain side selection gate transistor and the source side selection gate transistor to an ON state.

When data is written on the memory cell transistor MT, the writing voltage applied to the electrode film WL is, for example, 17 V or more. In contrast, the fourth potential V04 mentioned above is about 10 V, and thus soft writing is performed in the second operation E2.

The soft writing voltage VpgmW is a voltage lower than the voltage of the ordinary writing pulse (for example, a voltage of 60% or less of the ordinary writing voltage). For example, when the voltage of the ordinary data writing pulse is 17 V, the soft writing voltage VpgmW is set to not more than about 10 V. The soft writing voltage VpgmW does not create those states in which a large FN current (Flower-Nordheim releasing current) flows in the tunnel insulating film, but is a voltage enough to release charges (in this case, holes) at shallow energy levels trapped near the interface between the channel and the tunnel insulating film.

Thereby, as illustrated in FIG. 8B, the holes cg2b captured in traps at shallow energy levels at the interface between the semiconductor pillar SP and the inner insulating film 42 and in a portion of the inner insulating film 42 near the interface are extracted toward, for example, the semiconductor pillar SP. That is, the state of the holes cg2a captured in the memory layer 48 does not change substantially, and only the holes cg2b captured in traps at shallow energy levels are released.

Thereby, as illustrated in FIG. 8C, the holes cg2b captured in traps at shallow energy levels at the interface between the semiconductor pillar SP and the inner insulating film 42 and in a portion of the inner insulating film 42 on the semiconductor pillar SP side, that is, near the channel interface disappear, and only the holes cg2a captured in the memory layer 48 remain, which creates a normal erasing state.

By the second operation E2, the threshold of the memory cell transistor MT rises by about 1 V, for example, from the moment after the first operation E1, and becomes the target value (e.g. −2 V) as a result.

Thus, in the nonvolatile semiconductor memory device 110 according to this embodiment, the erase operation EP may include the combination of the first operation E1 of strong erasing and the second operation E2 of soft writing. Thereby, the holes cg2b captured at shallow energy levels near the channel interface can be removed beforehand, and data retention characteristics at the time of erasing can be improved.

Figure 9:
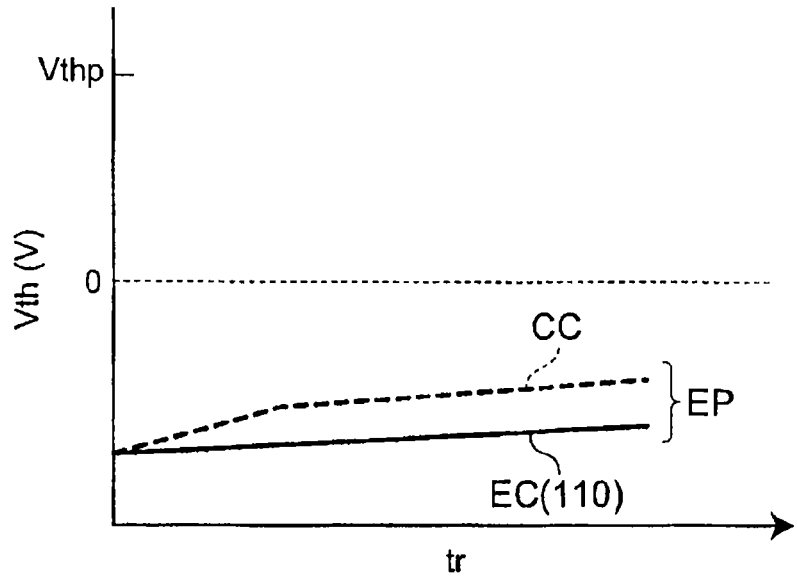
FIG. 9 is a graph illustrating characteristics of the nonvolatile semiconductor memory device according to the first embodiment.

FIG. 9 is a graph illustrating characteristics of the nonvolatile semiconductor memory device according to the first embodiment.

More specifically, the horizontal axis of the drawing represents the retention time tr after finishing the erase operation EP; and the vertical axis represents the threshold Vth of the memory cell transistor MT. That is, the drawing illustrates data retention characteristics. The drawing illustrates characteristics EC of the nonvolatile semiconductor memory device 110 according to this embodiment and characteristics CC of a nonvolatile semiconductor memory device of a comparative example. These characteristics are those in the case of a temperature of 85° C. The drawing illustrates also the threshold Vthp of the write operation PP.

In the nonvolatile semiconductor memory device of the comparative example, the erase operation EP does not include the second operation E2 of soft writing. That is, the erasing voltage Vera is applied to the wiring WR so as to obtain the target threshold Vth to perform the erase operation EP. Other than this, operations similar to the nonvolatile semiconductor memory device 110 are performed.

As illustrated in FIG. 9, in the characteristics CC of the nonvolatile semiconductor memory device of the comparative example, the threshold Vth rapidly rises and then slowly rises as the retention time tr passes. The retention time tr presenting this rapid rise is about several seconds to several minutes, for example. Thus, in the comparative example, retention characteristics in the erase operation EP are low, and the change of the threshold Vth to the retention time tr is large. This is probably because, after the erasing voltage Vera is applied, holes cg2b are captured in traps at shallow energy levels at the interface between the semiconductor pillar SP and the inner insulating film 42 and in a portion of the inner insulating film 42 on the semiconductor pillar SP side, and the holes cg2b are released in a relatively short time.

In contrast, as illustrated in FIG. 9, in the characteristics EC of the nonvolatile semiconductor memory device 110 according to this embodiment, the threshold Vth does not rapidly rise as the retention time tr passes, but is almost constant. This is because, in the nonvolatile semiconductor memory device 110, the first operation E1 of strong erasing and the second operation E2 of soft writing are performed in the erase operation EP, and therefore the holes cg2b captured in traps at shallow energy levels, which occur in the first operation E1, are released by the second operation E2. Thereby, the nonvolatile semiconductor memory device 110 improves retention characteristics in the erase operation EP.

A collectively patterned three-dimensional multilayer memory can perform an operation that uses, for example, the difference in electric field between the inner insulating film 42 and the outer insulating film 43 based on the difference in curvature between the inside and the outside of a cylindrical charge storage layer. At this time, the variation of this electric field may become large due to, for example, the variation of the shape or size of the through hole TH, and accordingly retention characteristics may degrade. In such cases, using the operation according to this embodiment can suppress the degradation of retention characteristics in the erase operation EP.

In the second operation E2 of soft writing, since the holes cg2a captured in the memory layer 48 are located at positions distant from the channel, the holes cg2a have a limited effect on the variation of the threshold Vth. Therefore, although more holes cg2a may be captured in the memory layer 48 in the nonvolatile semiconductor memory device 110 than in the comparative example which does not perform soft writing (the case where holes cg2b exist also near the channel interface), the capture in this case is a capture into deep stable energy levels; therefore, substantially no problem occurs about reliability.

In the above, the case is described where holes cg2a are injected into and stored in the memory layer 48 in the erase operation EP. However, it is sufficient that at least one of injection of holes cg2a into the memory layer 48 and extraction of electrons from the memory layer 48 is performed.

Furthermore, in the above, the case is described where the electrode film WL and the back gate BG are set at the ground potential GND (that is, the reference potential V00) in the first operation E1 (strong erasing) mentioned above. However, since neither erasing nor writing is performed in the portion of the back gate BG, an operation is possible that sets the electrode film WL at the ground potential GND (the reference potential V00) and sets the back gate BG in a floating state.

Furthermore, although the case is described where the soft writing voltage VpgmW is applied to the electrode film WL and the back gate BG in the second operation E2 (soft writing) mentioned above, an operation is possible that applies the soft writing voltage VpgmW to the electrode film WL and sets the back gate BG in a floating state or at the ground potential GND (the reference potential V00) in the case where neither erasing nor writing is performed in the portion of the back gate BG.

Furthermore, although both of the source line SL and the bit line BL connected to both ends of the U-shaped semiconductor pillar SP are set at the same potential in this specific example, the invention is not limited thereto. That is, as described below, an operation is possible that sets the wiring WR (one of the source line SL and the bit line BL) connected to one end of the semiconductor pillar SP at a prescribed potential, and sets the other end (the other of the source line SL and the bit line BL) in a floating state.

Figures 10A, 10B:
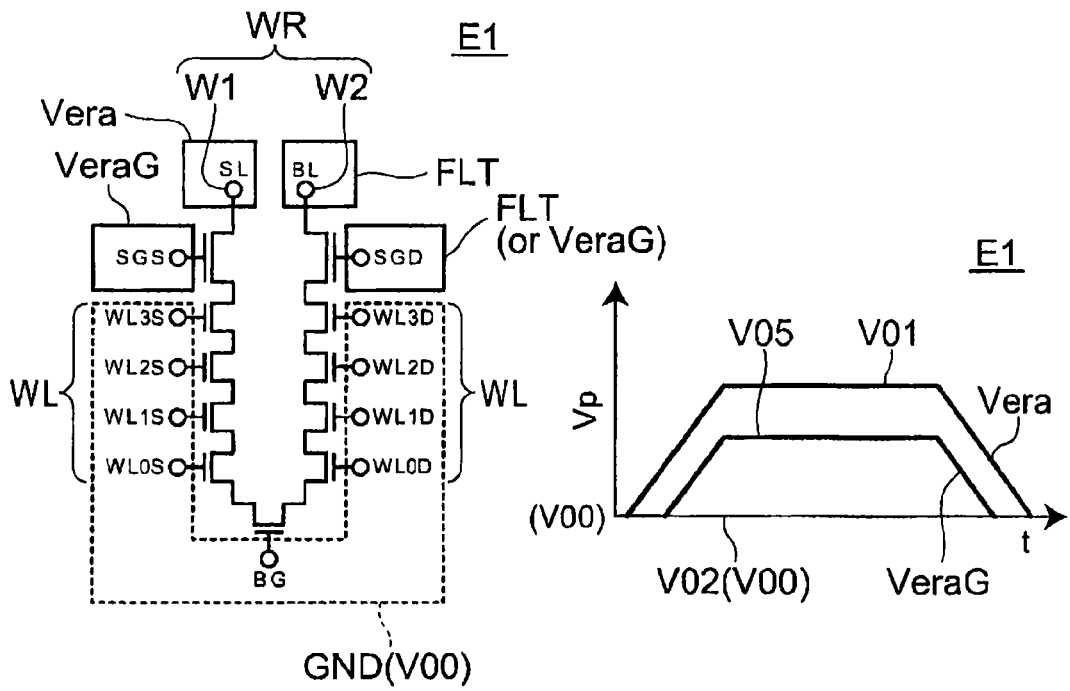
FIGS. 10A and 10B are schematic diagrams illustrating another operation of the nonvolatile semiconductor memory device according to the first embodiment.

FIGS. 10A and 10B are schematic diagrams illustrating another operation of the nonvolatile semiconductor memory device according to the first embodiment.

More specifically, FIGS. 10A and 10B are a schematic diagram and a graph, respectively, illustrating another state of potentials in the first operation E1.

As illustrated in FIGS. 10A and 10B, in the first operation E1 in the other operation, the erasing voltage Vera is applied to one wiring WR (being the first wiring W1, specifically the source line SL in this case), and the other wiring WR (being the second wiring W2, specifically the bit line BL in this case) is set in a floating state FLT.

The selection gate voltage in erasing VeraG is applied to the source side selection gate electrode SGS, and the drain side selection gate electrode SGD is set in a floating state FLT. Alternatively, the selection gate voltage in erasing VeraG may be applied to both the source side selection gate electrode SGS and the drain side selection gate electrode SGD.

The electrode film WL and the back gate BG are set at the ground potential GND (the reference potential V00).

Also in this case, the erasing voltage Vera and the selection gate voltage in erasing VeraG, that is, the first potential V01, the second potential V02, and the fifth potential V05 may be set as in the case described in regard to FIG. 6B and FIGS. 7A to 7C.

The strong erasing state illustrated in FIG. 8A can be created also when the first operation E1 described above is performed. After that, the second operation E2 (soft writing) described above is performed. Thereby, holes cg2b captured at shallow energy levels near the channel interface can be removed beforehand, and data retention characteristics at the time of erasing can be improved.

Second Embodiment

A nonvolatile semiconductor memory device 111 (not illustrated) according to a second embodiment improves data retention characteristics in the write operation. The nonvolatile semiconductor memory device 111 according to this embodiment has a configuration similar to the nonvolatile semiconductor memory device 110 except the operation of the control unit CTU.

Figure 11:
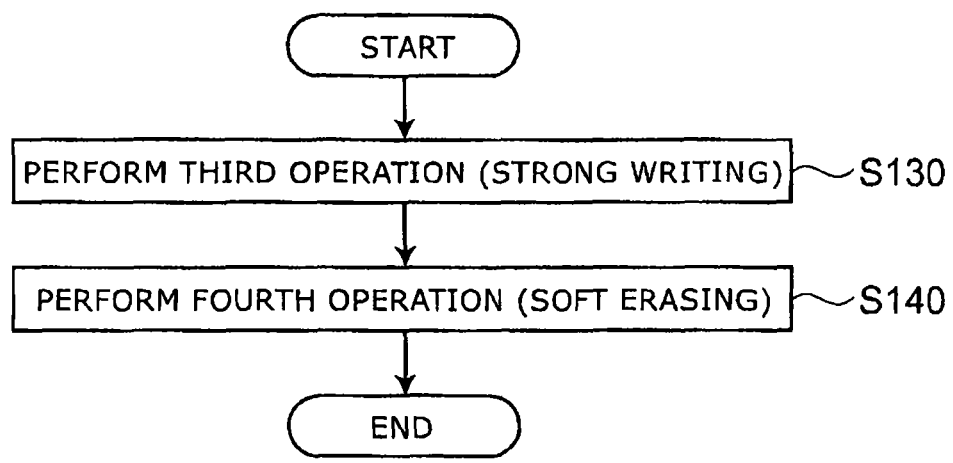
FIG. 11 is a flow chart illustrating an operation of a nonvolatile semiconductor memory device according to a second embodiment.

FIG. 11 is a flow chart illustrating an operation of the nonvolatile semiconductor memory device according to the second embodiment.

In this embodiment, the control unit CTU performs the third operation (step S130) and the fourth operation (step S140) described below when writing on one of the memory cell transistors MT. At this time, the write operation is an operation that performs at least one of: injection of electrons into at least one of the plurality of memory layers 48 (the memory layer 48 of a specific memory cell transistor MT on which data are written); and extraction of holes from the at least one of the plurality of memory layers 48.

As illustrated in FIG. 11, the control unit CTU performs, when performing the write operation, a third operation that sets the wiring WR at a seventh potential V07 and sets the electrode film WL opposed to at least one of the plurality of memory layers 48 at an eighth potential V08 higher than the seventh potential V07 (step S130). Here, the third operation makes the threshold of the memory cell transistor MT a value slightly higher than the target threshold. That is, what is called "strong writing" is performed.

After that, the control unit CTU performs a fourth operation that sets the wiring WR at a ninth potential V09 and sets the electrode film WL opposed to the at least one of the plurality of memory layers 48 at a tenth potential V10 lower than the ninth potential V09 (step S140). The fourth operation is an operation of the level that changes the threshold set slightly higher than the target by the third operation to the target threshold, that is, the operation of what is called "soft erasing."

Thus, in the write operation, "strong writing" (the third operation) that temporarily raises a threshold higher than the target threshold and "soft erasing" (the fourth operation) that subsequently sets to the target threshold may be performed in combination. Thereby, charges captured at shallow energy levels near the channel interface can be removed beforehand, and data retention characteristics in the write operation can be improved.

A specific example of the operation of the control unit CTU will now be described. In the following, an example is described of the case where data writing is performed on the memory cell transistor MT corresponding to an electrode film WL1D and data writing is not performed on the memory cell transistors MT corresponding to the other electrode films (e.g. electrode films WL0S to WL3S, an electrode film WL0D, and electrode films WL2D to WL3D, these being hereinafter referred to as "non-selected electrode films"). However, the position and number of memory cell transistors MT on which data are written are arbitrary.

FIGS. 12A to 12D are schematic diagrams illustrating an operation of the nonvolatile semiconductor memory device according to the second embodiment.

Figures 12A, 12B:
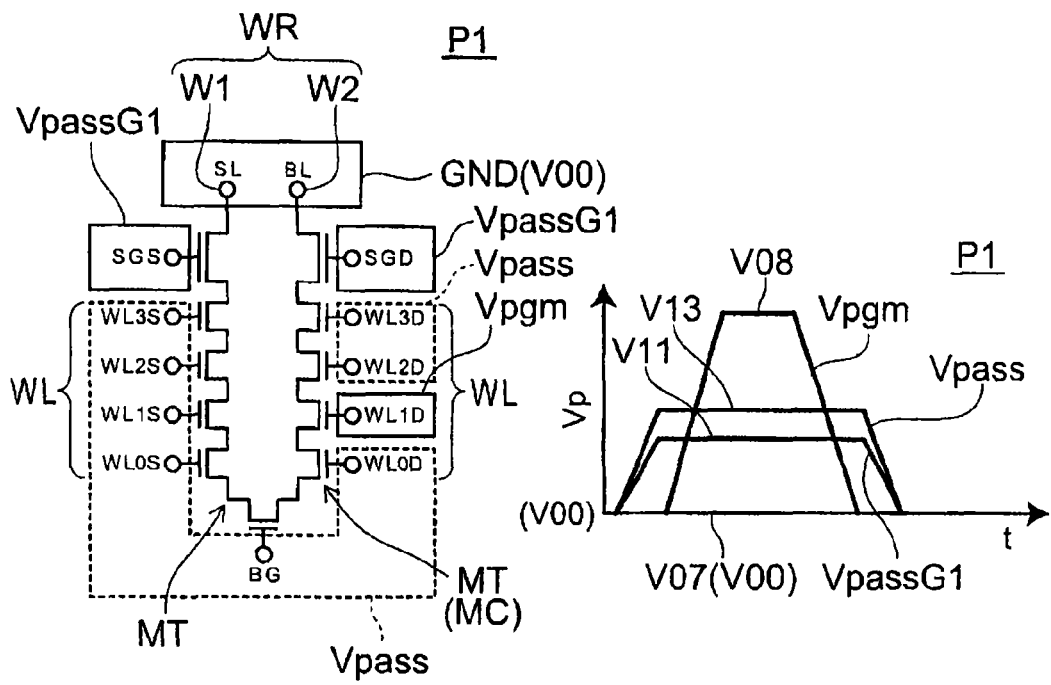
FIGS. 12A to 12D are schematic diagrams illustrating an operation of the nonvolatile semiconductor memory device according to the second embodiment.
Figures 12C, 12D:
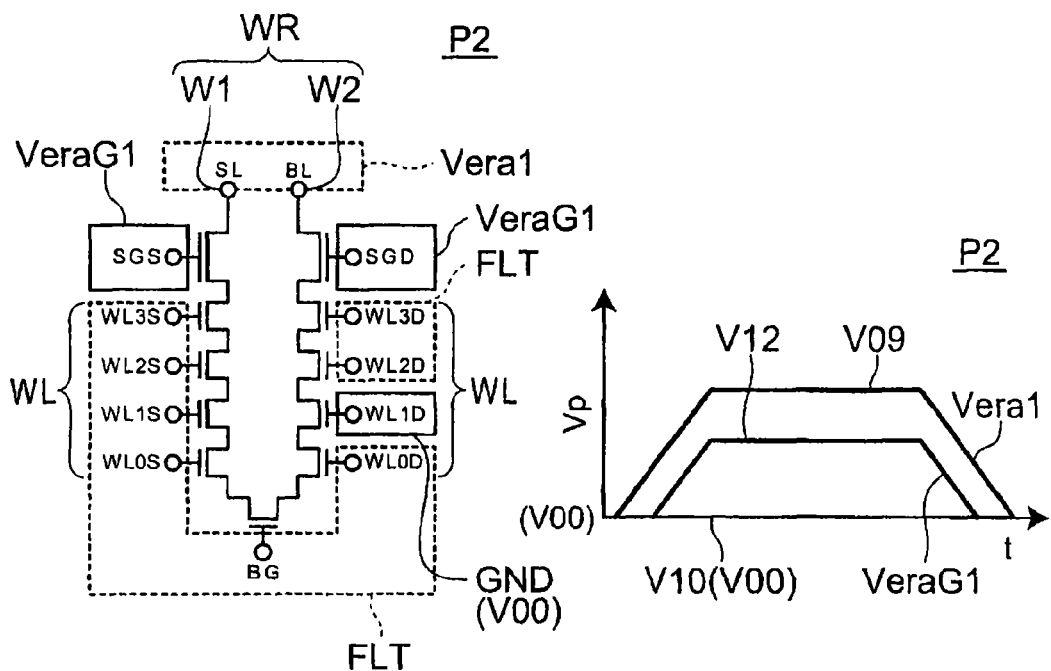

More specifically, FIGS. 12A and 12B are a schematic diagram and a graph, respectively, illustrating a state of potentials in the third operation. FIGS. 12C and 12D are a schematic diagram and a graph, respectively, illustrating a state of potentials in the fourth operation.

FIGS. 13A to 13D are schematic diagrams illustrating the operation of the nonvolatile semiconductor memory device according to the second embodiment.

Figure 13A:
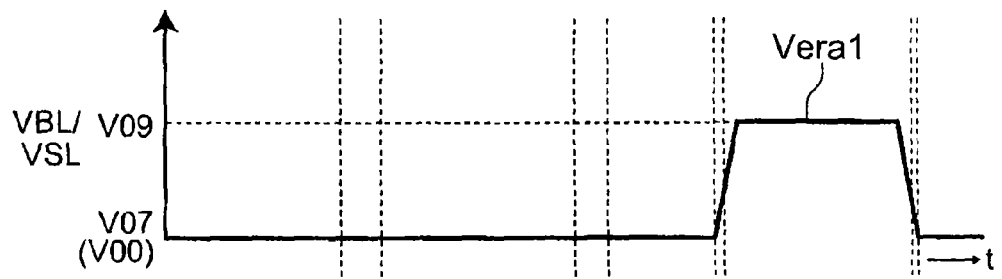
FIGS. 13A to 13D are schematic diagrams illustrating the operation of the nonvolatile semiconductor memory device according to the second embodiment.
Figure 13B:
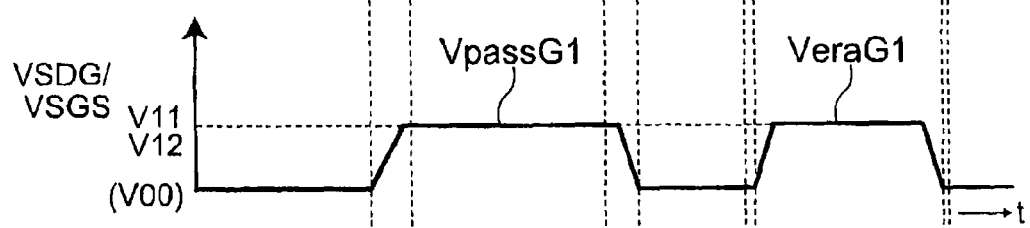
Figure 13C:
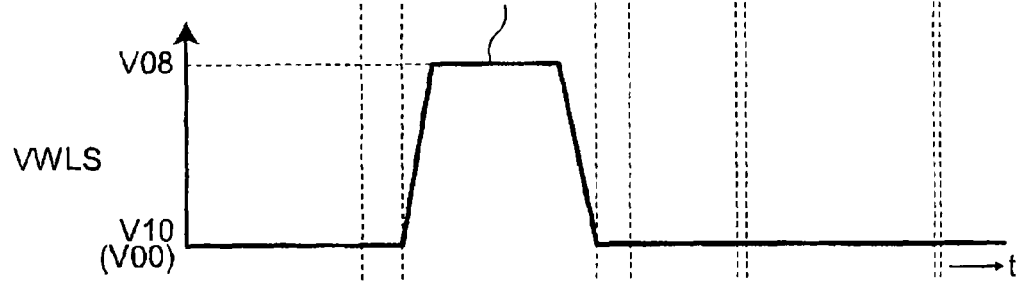
Figure 13D:
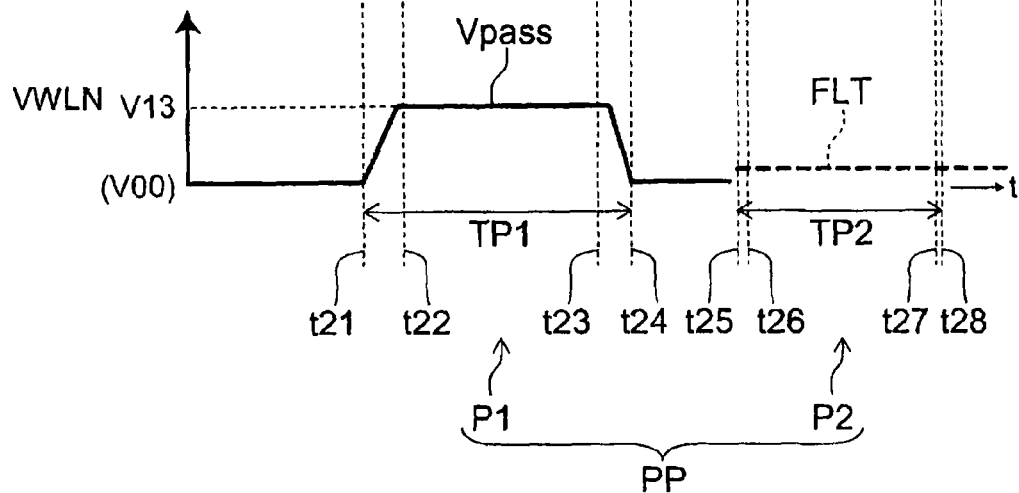

More specifically, FIG. 13A illustrates the potential of the wiring WR (the potential VBL of the bit line BL and the potential VSL of the source line SL) in the third operation and the fourth operation; FIG. 13B illustrates the potential VSGD of the drain side selection gate electrode SGD and the potential VSGS of the source side selection gate electrode SGS in the third operation and the fourth operation; FIG. 13C illustrates the potential VWLS of the electrode film WL1D of a writing destination in the third operation and the fourth operation; and FIG. 13D illustrates the potential VWLN of the non-selected electrode films in the third operation and the fourth operation.

Figure 14A:
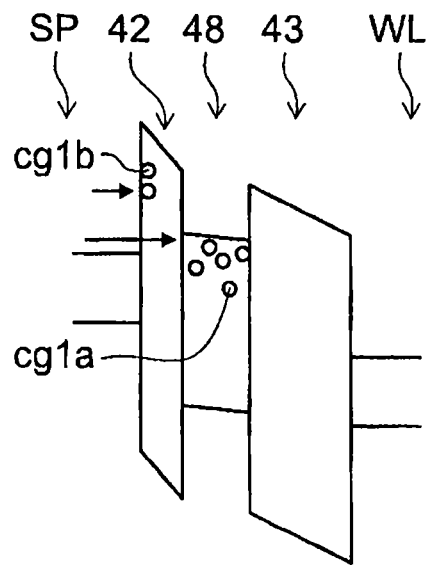
FIGS. 14A to 14C are schematic diagrams illustrating the operation of the nonvolatile semiconductor memory device according to the second embodiment.
Figure 14B:
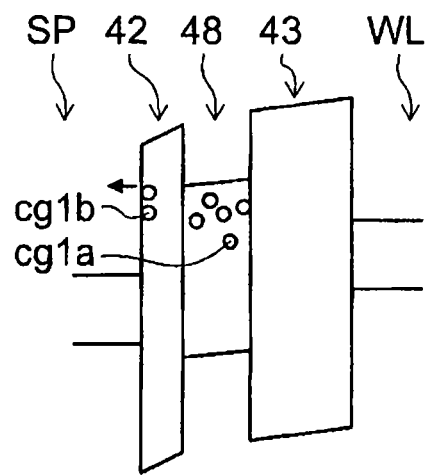
Figure 14C:
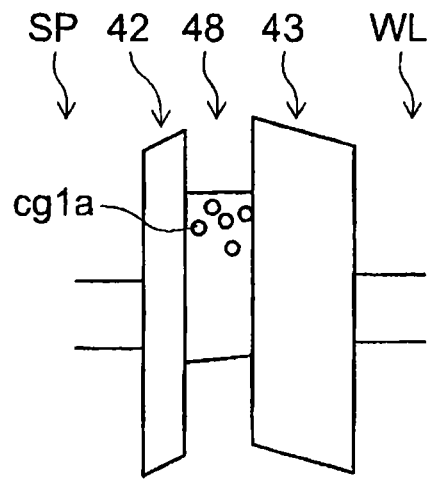

FIGS. 14A to 14C are schematic diagrams illustrating the operation of the nonvolatile semiconductor memory device according to the second embodiment.

More specifically, FIGS. 14A, 14B, and 14C are energy band diagrams in the third operation, in the fourth operation, and after the fourth operation, respectively.

As illustrated in FIGS. 12A and 12B, the wiring WR is set at the ground potential GND (the reference potential V00) in the third operation P1. A selection gate pass voltage in writing VpassG1 is applied to the drain side selection gate electrode SGD and the source side selection gate electrode SGS. A writing voltage Vpgm is applied to the electrode film WL1D of a writing destination. A pass voltage Vpass is applied to the non-selected electrode films and the back gate BG.

That is, in the third operation P1, the control unit CTU sets the wiring WR at the seventh potential V07 (the reference potential V00), and sets the electrode film WL1D of a writing destination (an electrode film opposed to at least one of the plurality of memory layers 48) at the eighth potential V08 (the writing voltage Vpgm) higher than the seventh potential V07. Further, the control unit CTU sets the selection gate electrode SG at an eleventh potential V11 (the selection gate pass voltage in writing VpassG1) higher than the seventh potential V07 and lower than the eighth potential V08. Further, the control unit CTU sets the non-selected electrode films (and the back gate BG) at a thirteenth potential V13 (the pass voltage Vpass) higher than the seventh potential V07 and lower than the eighth potential V08.

For example, as illustrated in FIGS. 13A to 13D, in period TP1 in the third operation P1, the potential of the wiring WR (the potential VBL of the bit line BL and the potential VSL of the source line SL) is the seventh potential V07 (e.g. the reference potential V00). The selection gate pass voltage in writing VpassG1 rises from the reference potential V00 at time t21 to reach the eleventh potential V11, and then lowers to return to the reference potential V00 at time t24. The writing voltage Vpgm rises from the reference potential V00 at time t22 to reach the eighth potential V08, and then lowers to return to the reference potential V00 at time t23. The pass voltage Vpass rises from the reference potential V00, for example at time t21, to reach the thirteenth potential V13, and then lowers to return to the reference potential V00 at time t24.

The eighth potential V08 is 17 V, for example; the eleventh potential V11 is 5 to 7 V, for example; the thirteenth potential V13 is 7 to 9 V, for example; and the reference potential V00 is 0 V, for example.

Time t22 is a time not prior to time t21, and time t23 is a time not posterior to time t24.

Thus, in the third operation P1, the control unit CTU starts to change the potential of the electrode film WL opposed to the at least one of the memory layers 48 from a low potential lower than the eighth potential V08 (for example, the tenth potential V10) toward the eighth potential V08 not prior to setting the potential of the selection gate electrode SG to the eleventh potential V11; thereafter starts to lower the potential of the selection gate electrode SG from the eleventh potential V11 not prior to setting the potential of the electrode film WL opposed to the at least one of the memory layers 48 at the tenth potential V10.

By applying such voltages, electrons are injected into the memory layer 48 of the memory cell transistor MT formed at the intersection of the electrode film WL1D of a writing destination and the semiconductor pillar SP. At this time, the writing voltage Vpgm is set so that the threshold of the memory cell transistor MT may be a value slightly higher (for example, a value higher by about 1 V) than the target threshold of the writing state.

Thereby, as illustrated in FIG. 14A, electrons are injected from the semiconductor pillar SP side toward the electrode film WL, and electrons cg1a are captured in the memory layer 48. At this time, electrons cg1b are captured also in traps at shallow energy levels at the interface between the semiconductor pillar SP and the inner insulating film 42 and in a portion of the inner insulating film 42 on the semiconductor pillar SP side.

Then, as illustrated in FIGS. 12C and 12D, in the fourth operation P2, a soft erasing voltage Vera1 is applied to the wiring WR; a selection gate voltage in soft erasing VeraG1 is applied to the drain side selection gate electrode SGD and the source side selection gate electrode SGS; the electrode film WL1D of a writing destination is set at the ground potential GND (the reference potential V00); and the non-selected electrode films and the back gate BG are set in a floating state FLT. Alternatively, the non-selected electrode films may be set at a potential (a middle potential) higher than the second potential V02 and lower than the first potential V01.

That is, in the fourth operation P2, the control unit CTU sets the wiring WR at the ninth potential V09 (the soft erasing voltage Vera1), and sets the electrode film WL1D of a writing destination at the tenth potential V10 (in this case, the reference potential V00) lower than the ninth potential V09. Further, the control unit CTU sets the selection gate electrode SG at a twelfth potential V12 (the selection gate voltage in soft erasing VeraG1) lower than the ninth potential V09 and higher than the tenth potential V10. Further, the control unit CTU sets the non-selected electrode films (and the back gate BG) in a floating state FLT. Alternatively, the control unit CTU sets the non-selected electrode films at a potential (a middle potential) higher than the second potential V02 and lower than the first potential V01.

For example, as illustrated in FIGS. 13A to 13D, in period TP2 in the fourth operation P2, the soft erasing voltage Vera1 rises from the reference potential V00 at time t25 to reach the ninth potential V09, and then lowers to return to the reference potential V00 at time t28. The selection gate voltage in soft erasing VeraG1 rises from the reference potential V00 at time t26 to reach the twelfth potential V12, and then lowers to return to the reference potential V00 at time t27. Time t26 is a time not prior to time t25, and time t27 is a time not posterior to time t28.

That is, in the fourth operation P2, the control unit CTU starts to change the potential of the selection gate electrode SG from a low potential lower than the twelfth potential 12 (for example, the tenth potential V10) toward the twelfth potential V12 not prior to starting to change the potential of the wiring WR from the seventh potential V07 toward the ninth potential V09; thereafter finishes changing the potential of the wiring WR from the ninth potential V09 toward the seventh potential V07 not prior to finishing changing the potential of the selection gate electrode SG from the twelfth potential V12 toward the low potential lower than the twelfth potential 12 (for example, the tenth potential V10).

The ninth potential V09 is 10 V to 12 V, for example; the twelfth potential V12 is 5 V to 7 V, for example; and the reference potential V00 is 0 V, for example. That is, the maximum value of the selection gate voltage in soft erasing VeraG1 (that is, the difference between the twelfth potential V12 and the reference potential V00) is a voltage of the level that switches the drain side selection gate transistor and the source side selection gate transistor to the ON state.

The soft erasing voltage Vera1 is a voltage much lower than the voltage of the ordinary erasing pulse (a voltage of 60% or less of the voltage of the ordinary erasing pulse). For example, when the voltage of the ordinary erasing pulse is 20 V, it is preferably set to 12 V or less. The soft erasing voltage Vera1 does not create those states in which a large FN current flows in the tunnel insulating film, but is a voltage sufficient to release charges (electrons) at shallow energy levels trapped near the channel/(tunnel insulating film) interface.

Thereby, as illustrated in FIG. 14B, the electrons cg1*b* captured in traps at shallow energy levels at the interface between the semiconductor pillar SP and the inner insulating film 42 and in a portion of the inner insulating film 42 near the interface are extracted toward, for example, the semiconductor pillar SP. That is, the state of the electrons cg1*a* captured in the memory layer 48 does not change substantially, and only the electrons cg1*b* captured in traps at shallow energy levels are released.

Thereby, as illustrated in FIG. 14C, the electrons cg1*b* captured in traps at shallow energy levels at the interface between the semiconductor pillar SP and the inner insulating film 42 and in a portion of the inner insulating film 42 on the semiconductor pillar SP side, that is, near the channel interface disappear, and only the electrons cg1*a* captured in the memory layer 48 remain, which creates a normal writing state.

Then, by the fourth operation P2, the threshold of the memory cell transistor MT lowers from the moment after the third operation P1, and becomes the target threshold as a result.

Thus, in the nonvolatile semiconductor memory device 111 according to this embodiment, the write operation PP includes the combination of the third operation P1 of strong writing and the fourth operation P2 of soft erasing; thereby, the electrons cg1*b* captured at shallow energy levels near the channel interface can be removed beforehand, and data retention characteristics at the time of writing can be improved.

In those cases where the property is obtained that data retention characteristics in the write operation PP degrade significantly with respect to data retention characteristics of the erase operation EP, and the degradation occurs only for a short time and then be resolved, since the write operation PP usually performs writing for each electrode film WL, soft erasing may be performed for each electrode film WL.

Specifically, in the fourth operation P2, the non-selected electrode films are set in a floating state FLT. Thereby, as the potential of the semiconductor pillar SP rises, the potentials of the electrode films WL in the floating state FLT also rise due to the coupling effect. Therefore, substantially no potential difference occurs between the semiconductor pillar SP and the electrode films WL in the floating state FLT, and thus faulty erasing of data can be suppressed in the memory cell transistors MT corresponding to the electrode films WL in the floating state FLT. By setting the non-selected electrode films at the middle potential, faulty erasing of data can be suppressed in the memory cell transistors MT corresponding to the electrode films WL.

Figure 15:
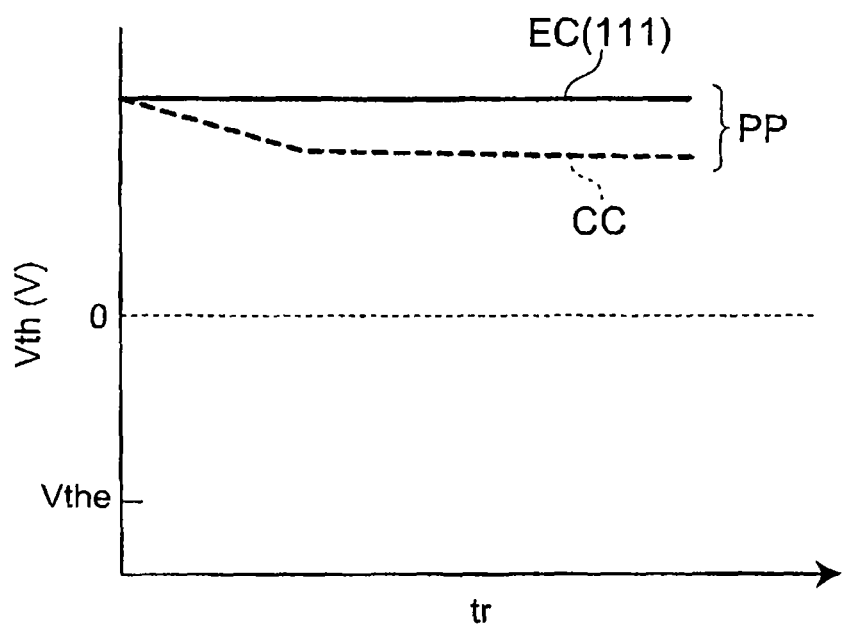
FIG. 15 is a graph illustrating characteristics of the nonvolatile semiconductor memory device according to the second embodiment.

FIG. 15 is a graph illustrating characteristics of the nonvolatile semiconductor memory device according to the second embodiment.

More specifically, the horizontal axis of the drawing represents the retention time tr after finishing the write operation PP, and the vertical axis represents the threshold Vth of the memory cell transistor MT. That is, the drawing illustrates data retention characteristics. Here, the drawing illustrates characteristics EC of the nonvolatile semiconductor memory device 111 according to this embodiment and characteristics CC of a nonvolatile semiconductor memory device of a comparative example. These characteristics are those in the case of a temperature of 85° C. The drawing illustrates also the threshold Vthe of the erase operation EP.

In the nonvolatile semiconductor memory device of the comparative example, the write operation PP does not include the fourth operation P2 of soft erasing. That is, the writing voltage Vpgm is applied to the electrode film WL1D so as to obtain the target threshold Vth to perform the write operation PP. Other than this, operations similar to the nonvolatile semiconductor memory device 111 are performed.

As illustrated in FIG. 15, in the characteristics CC of the nonvolatile semiconductor memory device of the comparative example, the threshold Vth rapidly lowers and then slowly lowers as the retention time tr passes. Thus, in the comparative example, retention characteristics in the write operation PP are low, and the change of the threshold Vth to the retention time Tr is large. This is probably because, after the writing voltage Vpgm is applied, electrons cg1b are captured in traps at shallow energy levels at the interface between the semiconductor pillar SP and the inner insulating film 42 and in a portion of the inner insulating film 42 on the semiconductor pillar SP side, and the electrons cg1b are released in a relatively short time.

In contrast, as illustrated in FIG. 15, in the characteristics EC of the nonvolatile semiconductor memory device 111 according to this embodiment, the threshold Vth does not rapidly lower as the retention time tr passes, and the threshold Vth is almost constant. This is because, in the nonvolatile semiconductor memory device 111, the third operation P1 of strong writing and the fourth operation P2 of soft erasing are performed in the write operation PP, and therefore the electrons cg1b captured in traps at shallow energy levels, which occur in the third operation P1, are released by the fourth operation P2. Thereby, the nonvolatile semiconductor memory device 111 improves retention characteristics in the write operation PP.

As described above, in the case where, for example, data retention characteristics degrade due to the variation of the difference in electric field between the inner insulating film 42 and the outer insulating film 43 based on the difference in curvature between the inner side and the outer side of a cylindrical charge storage layer, using the operation according to this embodiment can suppress the degradation of retention characteristics in the write operation PP.

In the fourth operation P2 of soft erasing, since the electrons cg1a captured in the memory layer 48 are located at positions distant from the channel, the electrons cg1a have a limited effect on the variation of the threshold Vth. Therefore, although more electrons cg1a may be captured in the memory layer 48 in the nonvolatile semiconductor memory device 111 than in the comparative example which does not perform soft erasing (the case where electrons cg1b exist also near the channel interface), the capture in this case is a capture into deep stable energy levels; therefore, substantially no problem occurs about reliability.

In the above, the case is described where electrons cg1a are injected into and stored in the memory layer 48 in the write operation PP. However, it is sufficient that at least one of injection of electrons cg1a into the memory layer 48 and extraction of holes from the memory layer 48 is performed.

An example will now be described of the third operation P1 and the fourth operation P2 in the case where a large number of U-shaped NAND strings are provided.

Figure 16A:
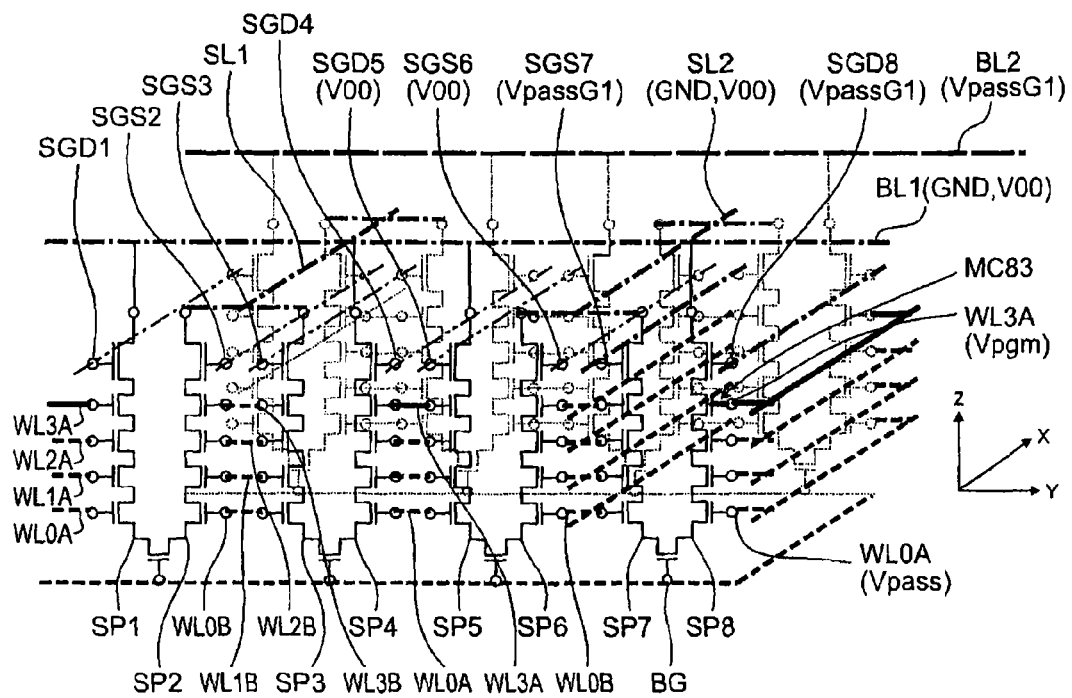
FIGS. 16A and 16B are schematic diagrams illustrating an operation of the nonvolatile semiconductor memory device according to the second embodiment.
Figure 16B:
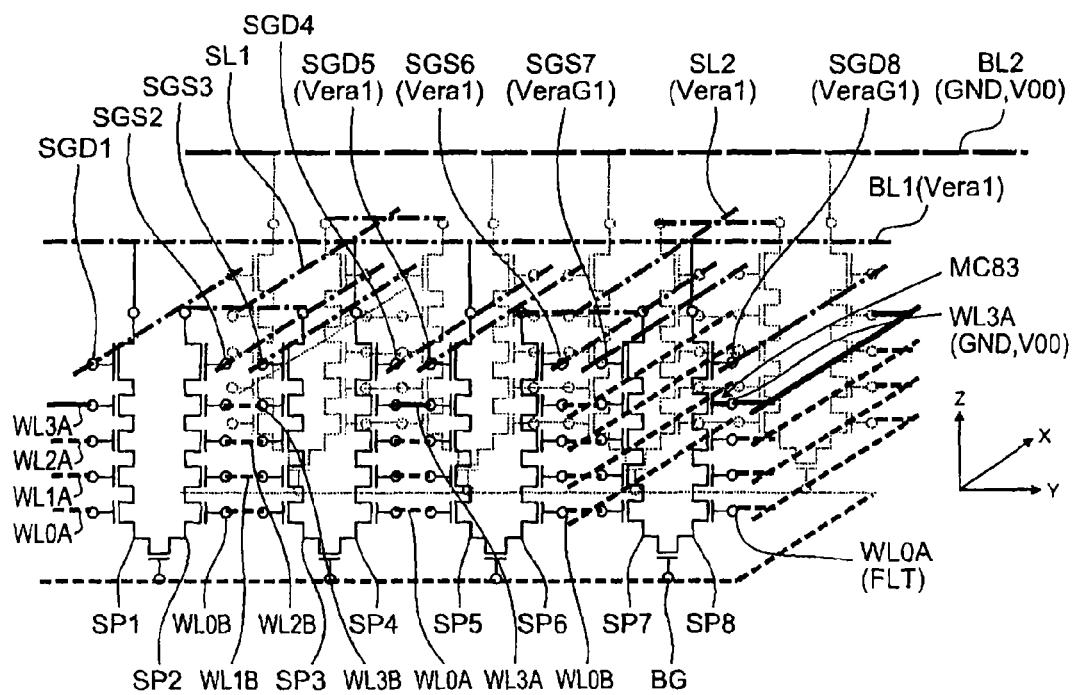

FIGS. 16A and 16B are schematic diagrams illustrating an operation of the nonvolatile semiconductor memory device according to the second embodiment.

More specifically, FIGS. 16A and 16B illustrate the relationships between voltages in the third operation P1 and the fourth operation P2, respectively. In these drawings, the solid line, broken line, and alternate long and short dash line represent the electrical connection relationships between components; and the type (including the length of the space in the broken line and alternate long and short dash line, etc.) and the thickness of the lines represent the type of potential (applied voltage). For easier viewing of the drawings, part of the line is omitted and parts of the lines between mutually connected components are not drawn in the drawings.

As illustrated in FIG. 16A, in this specific example, an example is described of the case where data are written on the uppermost memory cell MC83 of the right-hand eighth semiconductor pillar SP8 of the rightmost NAND string in the drawing out of four U-shaped NAND strings.

As illustrated in FIG. 16A, in the third operation P1 (strong writing), the selection gate pass voltage in writing VpassG1 that creates the ON state is applied to: a drain side selection gate electrode SGD8 opposed to the selected eighth semiconductor pillar SP8; and a source side selection gate electrode SGS7 opposed to a seventh semiconductor pillar SP7. The selection gate electrodes of non-selected semiconductor pillars SP1 to SP6 (drain side selection gate electrodes SGD1, SGD4, and SGD5 and source side selection gate electrodes SGS2, SGS3, and SGS6) are set at a potential of the OFF state (e.g. the reference potential V00). The writing voltage Vpgm is applied to an electrode film WL3A that is a selected bit. The pass voltage Vpass is applied to electrode films that are non-selected bits (e.g. electrode films WL0A to WL2A and WL0B to WL3B). The bit line BL1 corresponding to the memory cell MC83 that is a selected cell and the source line (e.g. source lines SL1 and SL2) are set at the ground potential GND (the reference potential V00), and the selection gate pass voltage in writing VpassG1 is applied to the other bit lines (e.g. a bit line BL2).

As illustrated in FIG. 16B, in the fourth operation P2 (soft erasing), the soft erasing voltage Vera1 is applied to the bit line BL1 corresponding to the memory cell MC83 that is a selected cell and the source line (e.g. the source lines SL1 and SL2); and the other bit lines (e.g. the bit line BL2) are set at the ground potential GND (the reference potential V00). The selection gate voltage in soft erasing VeraG1 is applied to: the drain side selection gate electrode SGD8 opposed to the selected eighth semiconductor pillar SP8; and the source side selection gate electrode SGS7 opposed to the seventh semiconductor pillar SP7. The soft erasing voltage Vera1 is applied to the selection gate electrodes of the non-selected semiconductor pillars SP1 to SP6 (the drain side selection gate electrodes SGD1, SGD4, and SGD5 and the source side selection gate electrodes SGS2, SGS3, and SGS6). The electrode film WL3A that is a selected bit is set at the ground potential GND (the reference potential V00). The electrode films that are non-selected bits (e.g. the electrode films WL0A to WL2A and WL0B to WL3B) are set in a floating state FLT. Alternatively, the electrode films that are non-selected bits are set at the middle potential.

Such application of voltages and setting of potentials are performed by the control unit CTU. Thereby, the operation and effects mentioned above are obtained.

Although this specific example is an example in which soft erasing is performed on a selected memory cell MC, the invention is not limited thereto. For example, full-scale erasing (block erasing) using weak voltage conditions under which only charges captured at shallow energy levels are released, may be performed as soft erasing. In this case, memory cells MC on which writing is not performed or memory cells MC of which the thresholds have already been fixed by writing and soft erasing (the third operation P1 and the fourth operation P2) include no charges captured at shallow energy levels; therefore, a threshold variation does not occur.

Furthermore, for example, an operation is possible that performs writing of a higher level than a desired threshold on all the desired memory cells MC included in a block (performs the third operation P1), and then performs soft erasing at one time on all the memory cells MC included in the block (the fourth operation P2) to release traps at shallow levels in the memory cells MC included in the block.

Figures 17A, 17B:
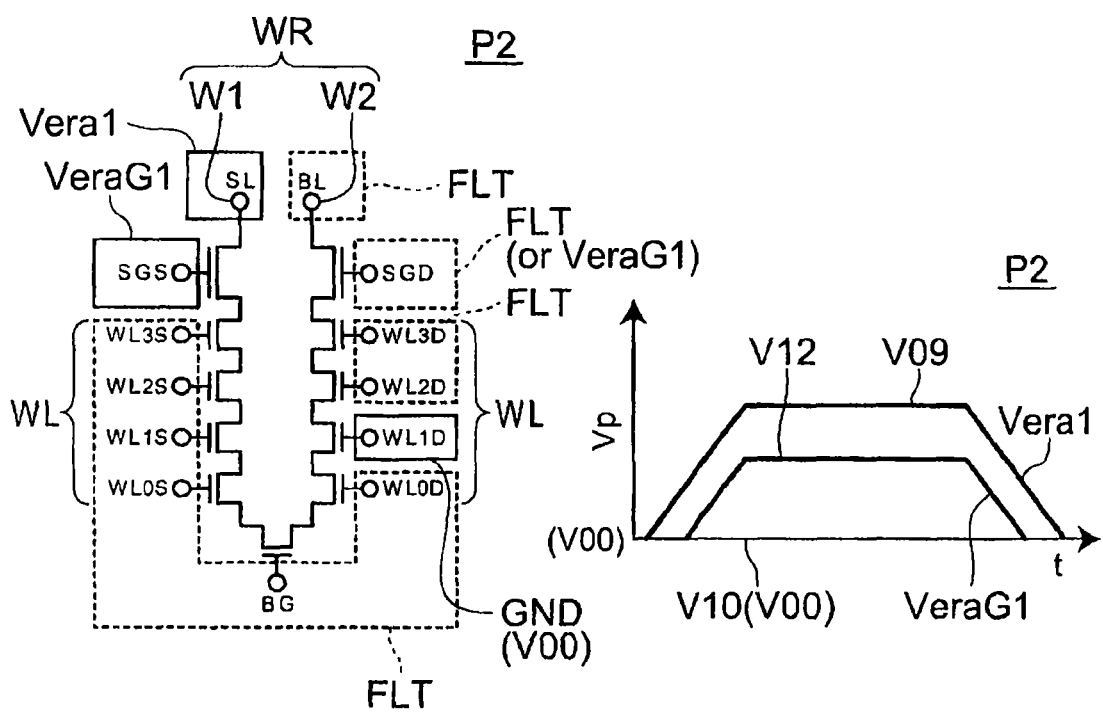
FIGS. 17A and 17B are schematic diagrams illustrating another operation of the nonvolatile semiconductor memory device according to the second embodiment.

FIGS. 17A and 17B are schematic diagrams illustrating another operation of the nonvolatile semiconductor memory device according to the second embodiment.

More specifically, FIGS. 17A and 17B are a schematic diagram and a graph, respectively, illustrating another state of potentials in the fourth operation P2.

As illustrated in FIGS. 17A and 17B, in the fourth operation P2 in the other operation, the erasing voltage Vera is applied to one wiring WR (being the first wiring W1, specifically the source line SL in this case), and the other wiring WR (being the second wiring W2, specifically the bit line BL in this case) is set in a floating state FLT.

The selection gate voltage in soft erasing VeraG1 is applied to the source side selection gate electrode SGS, and the drain side selection gate electrode SGD is set in a floating state FLT. Alternatively, the selection gate voltage in soft erasing VeraG1 may be applied to both the source side selection gate electrode SGS and the drain side selection gate electrode SGD.

The electrode film WL1D of a writing destination is set at the ground potential GND (the reference potential V00), and the non-selected electrode films and the back gate BG are set in a floating state FLT. Alternatively, the non-selected electrode films are set at the middle potential.

Also in this case, the soft erasing voltage Vera1 and the selection gate voltage in soft erasing VeraG1, that is, the ninth potential V09, the tenth potential V10, and the twelfth potential V12 may be set as in the case described in regard to FIG. 12D and FIGS. 13A to 13D. Thereby, soft erasing can be performed.

Then, the third operation P1 (strong writing) illustrated in FIGS. 12A and 12B is performed, and then the fourth operation P2 illustrated in FIGS. 17A and 17B is performed. Thereby, electrons cg1b captured at shallow energy levels near the channel interface can be removed beforehand, and data retention characteristics at the time of writing can be improved.

In the nonvolatile semiconductor memory device 111 according to this embodiment, the control unit CTU may perform both the operation described in regard to FIG. 1 and the operation described in regard to FIG. 11. That is, the combination of the first operation E1 (strong erasing) and the second operation E2 (soft writing) may be performed in the erase operation EP, and the combination of the third operation P1 (strong writing) and the fourth operation P2 (soft erasing) may be performed in the write operation PP.

In the above, strong erasing and strong writing refer to setting lower and higher, respectively, than the target threshold. However, for example, setting substantially at the target threshold is acceptable. It is sufficient that the relationships of potentials in strong erasing are the relationships illustrated in FIG. 6B and FIGS. 7A to 7C, and the relationships of potentials in strong writing are the relationships illustrated in FIG. 12B and FIGS. 13A to 13C. Furthermore, in the above, soft writing and soft erasing refer to causing substantially no change in the state of data to be stored; and it is sufficient that the relationships of potentials in soft writing are the relationships illustrated in FIG. 6D and FIGS. 7A to 7C, and the relationships of potentials in soft erasing are the relationships illustrated in FIG. 12D and FIGS. 13A to 13D.

Third Embodiment

Figure 18:
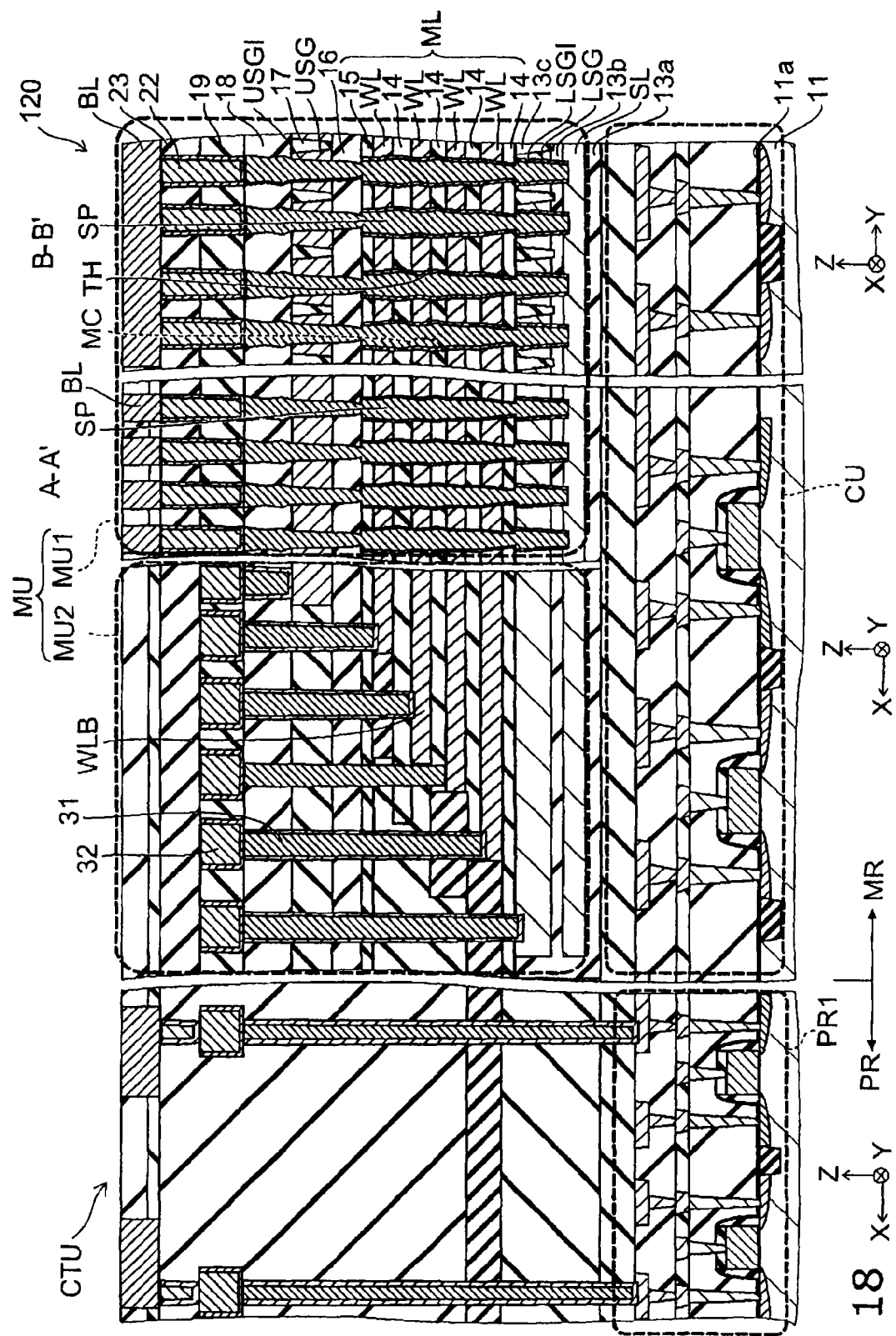
FIG. 18 is a schematic cross-sectional view illustrating the configuration of a nonvolatile semiconductor memory device according to a third embodiment.
Figure 19:
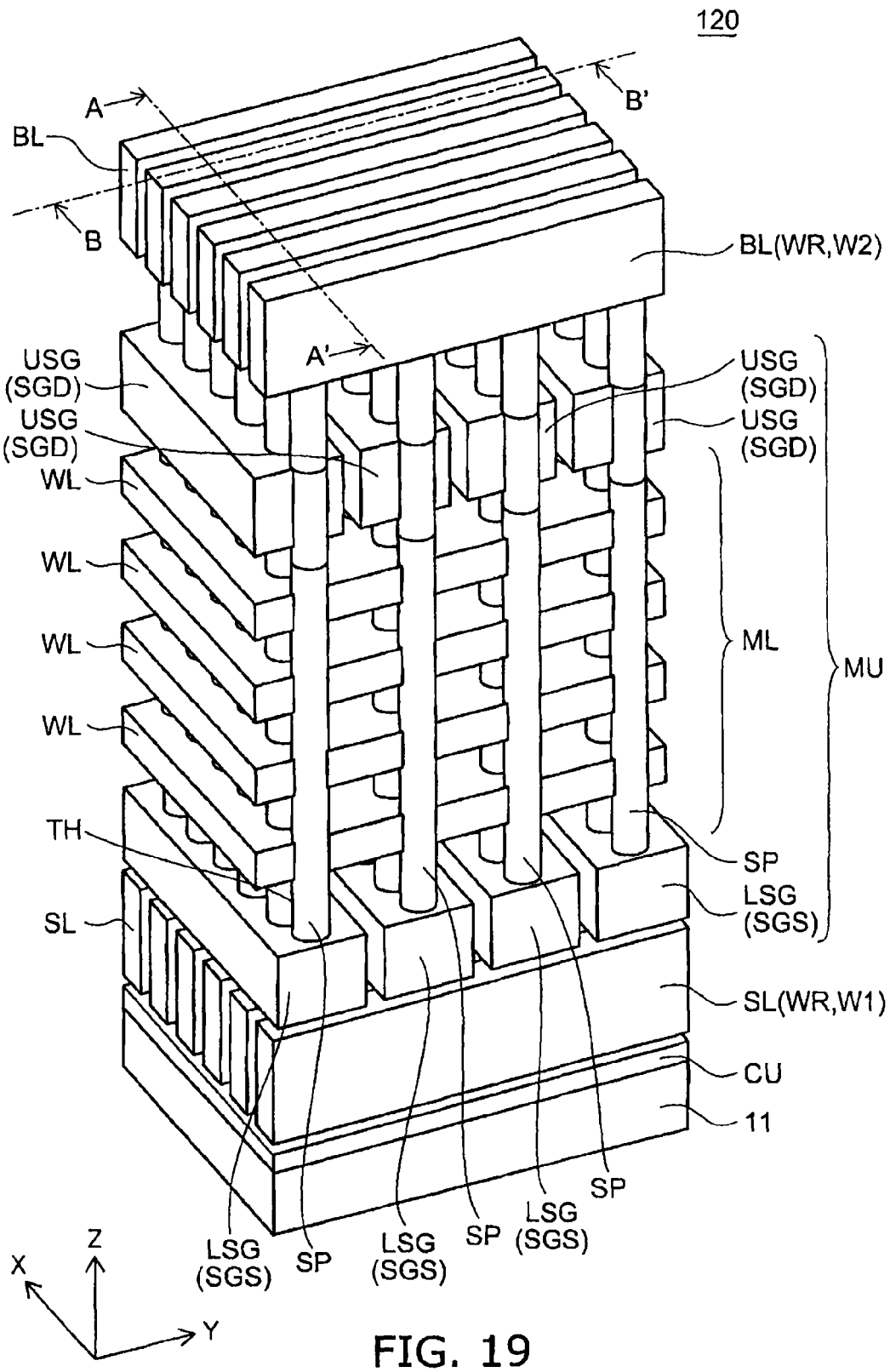
FIG. 19 is a schematic perspective view illustrating the configuration of the nonvolatile semiconductor memory device according to the third embodiment.

FIG. 18 and FIG. 19 are a schematic cross-sectional view and a schematic perspective view, respectively, illustrating the configuration of a nonvolatile semiconductor memory device according to a third embodiment.

For easier viewing of the drawing, FIG. 19 illustrates only conductive portions, and insulating portions are omitted.

As illustrated in FIG. 18 and FIG. 19, also a nonvolatile semiconductor memory device 120 according to this embodiment includes the memory unit MU and the control unit CTU.

In the memory unit MU, the semiconductor pillars SP are not connected in a U-shaped configuration, but each semiconductor pillar SP is independent. That is, the nonvolatile semiconductor memory device 120 includes a rectilinear NAND string. Further, an upper selection gate electrode USG (for example, to form the drain side selection gate electrode SGD) is provided on the multilayer structure ML, and a lower selection gate electrode LSG (for example, to form the source side selection gate electrode SGS) is provided below the multilayer structure ML.

An upper selection gate insulating film USGI made of, for example, silicon oxide is provided between the upper selection gate electrode USG and the semiconductor pillar SP, and a lower selection gate insulating film LSGI made of, for example, silicon oxide is provided between the lower selection gate electrode LSG and the semiconductor pillar SP.

The source line SL (being the wiring WR, for example the first wiring W1) is provided on the lower side of the lower selection gate electrode LSG. An interlayer insulating film 13a is provided below the source line SL, and an interlayer insulating film 13b is provided between the source line SL and the lower selection gate electrode LSG.

The semiconductor pillar SP is connected to the source line SL below the lower selection gate electrode LSG, and the semiconductor pillar SP is connected to the bit line BL (being the wiring WR, for example the second wiring W2) above the upper selection gate electrode USG. The memory cell MC is formed in the multilayer structure ML between the upper selection gate electrode USG and the lower selection gate electrode LSG, and the semiconductor pillar SP functions as one rectilinear NAND string.

The upper selection gate electrode USG and the lower selection gate electrode LSG are divided in the Y-axis direction by the interlayer insulating film 17 and an interlayer insulating film 13c, respectively, and have band configurations aligned along the X-axis direction.

On the other hand, the bit line BL connected to the upper portion of the semiconductor pillar SP and the source line SL connected to the lower portion of the semiconductor pillar SP have band configurations aligned in the Y-axis direction.

In this case, the electrode film WL is a planar conductive film parallel to the X-Y plane.

Also in the nonvolatile semiconductor memory device 120 of such a configuration, the control unit CTU can perform at least one of the operation described in regard to FIG. 1 and the operation described in regard to FIG. 11. That is, in the erase operation EP, the combination of the first operation E1 (strong erasing) and the second operation E2 (soft writing) is performed. Further, in the write operation PP, the combination of the third operation P1 (strong writing) and the fourth operation P2 (soft erasing) is performed.

Thus, the nonvolatile semiconductor memory device 120 including the rectilinear semiconductor pillar SP also can remove charges (holes cg2b and electrons cg1b) captured at shallow energy levels near the channel interface beforehand, and improve data retention characteristics in at least one of the erase operation and the write operation.

The following may be used for the inter-electrode insulating film 14, the inner insulating film 42, and the outer insulating film 43 of nonvolatile semiconductor memory devices according to embodiments of the invention: a single layer film of one selected from the group consisting of silicon oxide, silicon nitride, silicon oxynitride, aluminum oxide, aluminum oxynitride, hafnia, hafnium aluminate, hafnia nitride, hafnium nitride aluminate, hafnium silicate, hafnium nitride silicate, lanthanum oxide, and lanthanum aluminate, or a stacked film of two or more selected from the group.

The following may be used for the memory layer 48: a single layer film of one selected from the group consisting of silicon nitride, silicon oxynitride, aluminum oxide, aluminum oxynitride, hafnia, hafnium aluminate, hafnia nitride, hafnium nitride aluminate, hafnium silicate, hafnium nitride silicate, lanthanum oxide, and lanthanum aluminate, or a stacked film of two or more selected from the group.

In the specification of the application, "perpendicular" and "parallel" refer to not only strictly perpendicular and strictly parallel but also include, for example, the fluctuation due to manufacturing steps, etc. It is sufficient to be substantially perpendicular and substantially parallel.

Hereinabove, embodiments of the invention are described with reference to specific examples. However, the invention is not limited to these specific examples. For example, one skilled in the art may appropriately select specific configurations of components of nonvolatile semiconductor memory devices such as semiconductor substrates, electrode films, insulating films, insulating layers, multilayer structures, memory layers, charge storage layers, semiconductor pillars, word lines, bit lines, source lines, wirings, memory cell transistors, and selection gate transistors from known art and similarly practice the invention. Such practice is included in the scope of the invention to the extent that similar effects thereto are obtained.

Further, any two or more components of the specific examples may be combined within the extent of technical feasibility; and are included in the scope of the invention to the extent that the purport of the invention is included.

Moreover, all nonvolatile semiconductor memory devices practicable by an appropriate design modification by one skilled in the art based on the nonvolatile semiconductor memory devices described above as embodiments of the invention also are within the scope of the invention to the extent that the purport of the invention is included.

Furthermore, various modifications and alterations within the spirit of the invention will be readily apparent to those skilled in the art. All such modifications and alterations should be seen as within the scope of the invention. For example, additions, deletions, or design modifications of components or additions, omissions, or condition modifications of steps appropriately made by one skilled in the art in regard to the embodiments described above are within the scope of the invention to the extent that the purport of the invention is included.

The invention claimed is:

1. A nonvolatile semiconductor memory device comprising:
   a memory unit; and
   a control unit,
   the memory unit including:
   a multilayer structure including a plurality of electrode films and a plurality of inter-electrode insulating films alternately stacked in a first direction;
   a first semiconductor pillar piercing the multilayer structure in the first direction;
   a plurality of first memory layers provided between each of the electrode films and the first semiconductor pillar;
   a first inner insulating film provided between the first memory layer and the first semiconductor pillar;
   a first outer insulating film provided between each of the electrode films and the first memory layer; and
   a first wiring electrically connected to one end of the first semiconductor pillar, and
   the control unit, in an operation of performing at least one of injection of an electron into at least one of the plurality of first memory layers and extraction of a hole from the at least one of the first memory layers,
   performing a first operation of setting the first wiring at a first potential and setting at least one of the electrode films at a second potential higher than the first potential, the at least one of the first memory layers being disposed between the at least one of the electrode films and the first semiconductor pillar, and
   then performing a second operation of setting the first wiring at a third potential and setting the at least one of the electrode films at a fourth potential lower than the third potential.

2. The device according to claim 1, wherein a difference between the third potential and the fourth potential is smaller than a difference between the first potential and the second potential.

3. The device according to claim 1, wherein the first potential is substantially equal to the fourth potential.

4. The device according to claim 1, wherein
   the memory unit further includes a first selection gate electrode stacked on the multilayer structure in the first direction and pierced by the one end of the first semiconductor pillar, and
   the control unit
   sets the first selection gate electrode at a fifth potential higher than the first potential and lower than the second potential in a period of the first operation, and
   sets the first selection gate electrode at a sixth potential lower than the third potential and higher than the fourth potential in a period of the second operation.

5. The device according to claim 4, wherein,
   in the first operation, the control unit
   starts to change a potential of the at least one of the electrode films from a potential lower than the second potential toward the second potential not prior to setting a potential of the first selection gate electrode to the fifth potential, and
   after starting to change the potential of the at least one of the electrode films, starts to lower the potential of the first selection gate electrode from the fifth potential not prior to setting the potential of the at least one of the electrode films at the fourth potential.

6. The device according to claim 4, wherein,
   in the second operation, the control unit
   starts to change a potential of the first selection gate electrode from a potential lower than the sixth potential toward the sixth potential not prior to starting to change a potential of the first wiring from the first potential toward the third potential, and
   after starting to change the potential of the first selection gate electrode, finishes changing the potential of the first wiring from the third potential toward the first potential not prior to finishing changing the potential of the first selection gate electrode from the sixth potential toward the potential lower than the sixth potential.

7. The device according to claim 1, wherein
   the control unit
   sets the electrode films opposed to the plurality of first memory layers excluding the at least one of the first memory layers at a seventh potential higher than the first potential and lower than the second potential in a period of the first operation, and sets the electrode films opposed to the plurality of first memory layers excluding the at least one of the first memory layers in a floating state in a period of the second operation.

8. The device according to claim 1, wherein
the control unit
sets the electrode films opposed to the plurality of first memory layers excluding the at least one of the first memory layers at a seventh potential higher than the first potential and lower than the second potential in a period of the first operation, and
sets the electrode films opposed to the plurality of first memory layers excluding the at least one of the first memory layers at an eighth potential higher than the second potential and lower than the first potential in a period of the second operation.

9. The device according to claim 1, wherein the memory unit further includes:
a second semiconductor pillar piercing the multilayer structure in the first direction;
a second memory layer provided between each of the electrode films and the second semiconductor pillar;
a second inner insulating film provided between the second memory layer and the second semiconductor pillar;
a second outer insulating film provided between each of the electrode films and the second memory layer;
a second wiring electrically connected to one end of the second semiconductor pillar; and
a connecting portion electrically connected to another end of the first semiconductor pillar and another end of the second semiconductor pillar, and
the control unit sets the second wiring at the third potential or sets the second wiring in a floating state in the second operation.

10. The device according to claim 9, wherein
the memory unit further includes a second selection gate electrode stacked on the multilayer structure in the first direction and pierced by the second semiconductor pillar on a side of the one end of the second semiconductor pillar, and
the control unit sets the second selection gate electrode at a fifth potential or sets the second selection gate electrode in a floating state in the second operation.

11. The device according to claim 1, wherein,
in an operation of performing at least one of injection of a hole into the first memory layer and extraction of an electron from the first memory layer,
the control unit further
performs a third operation of setting the first wiring at a fifth potential and setting the at least one of the electrode films at a sixth potential lower than the fifth potential, and
then performs a second operation of setting the first wiring at a seventh potential and setting the at least one of the electrode films at an eighth potential higher than the seventh potential, and
a difference between the third potential and the fourth potential is smaller than a difference between the fifth potential and the sixth potential.

* * * * *